United States Patent
Park et al.

(10) Patent No.: US 9,721,795 B2
(45) Date of Patent: Aug. 1, 2017

(54) METHODS OF FORMING PATTERNS HAVING DIFFERENT SHAPES

(71) Applicant: SK hynix Inc., Gyeonggi-do (KR)

(72) Inventors: Jong Cheon Park, Gyeonggi-do (KR); You Song Kim, Gyeonggi-do (KR); Sung Kwang Kim, Gyeonggi-do (KR); Jung Hyung Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/816,848

(22) Filed: Aug. 3, 2015

(65) Prior Publication Data
US 2016/0254153 A1    Sep. 1, 2016

(30) Foreign Application Priority Data
Feb. 27, 2015   (KR) .................. 10-2015-0028623

(51) Int. Cl.
| | |
|---|---|
| *H01L 21/311* | (2006.01) |
| *H01L 21/033* | (2006.01) |
| *H01L 21/768* | (2006.01) |
| *H01L 21/28* | (2006.01) |
| *H01L 21/3105* | (2006.01) |
| *H01L 21/3213* | (2006.01) |
| *G03F 7/00* | (2006.01) |

(52) U.S. Cl.
CPC ........ *H01L 21/0338* (2013.01); *G03F 7/0002* (2013.01); *H01L 21/0332* (2013.01); *H01L 21/0337* (2013.01); *H01L 21/28194* (2013.01); *H01L 21/31056* (2013.01); *H01L 21/31144* (2013.01); *H01L 21/32139* (2013.01); *H01L 21/76831* (2013.01); *H01L 21/76843* (2013.01)

(58) Field of Classification Search
CPC ......... H01L 21/76831; H01L 21/76843; H01L 21/28194; H01L 21/31056
USPC ........ 438/696, 703, 717, 724, 725, 736, 757
See application file for complete search history.

(56) References Cited

U.S. PATENT DOCUMENTS

| | | | |
|---|---|---|---|
| 8,999,862 B1 | 4/2015 | Ban et al. | |
| 2009/0184374 A1* | 7/2009 | Clevenger | ......... H01L 21/31144 257/368 |
| 2012/0028477 A1 | 2/2012 | Lee et al. | |

(Continued)

FOREIGN PATENT DOCUMENTS

KR    1020100079948    7/2010

*Primary Examiner* — Binh X Tran
(74) *Attorney, Agent, or Firm* — IP & T Group LLP

(57) ABSTRACT

A method of forming patterns includes forming pillars and first peripheral patterns on an underlying layer, forming a separation wall layer covering sidewalls of the pillars and the first peripheral patterns, forming blocking portions on the separation wall layer to fill first openings between the first peripheral patterns, forming a block copolymer layer filling gap regions between the pillars, annealing the block copolymer layer to form first domains and a second domain surrounding the first domains, removing the first domains and removing portions of the separation wall layer to form second openings, removing the second domain and the blocking portions, removing the pillars and the first peripheral patterns to form third openings and fourth openings, and patterning the underlying layer to form fifth openings that extend from the second and third openings and sixth openings that extend from the fourth openings.

19 Claims, 35 Drawing Sheets

(56) References Cited

U.S. PATENT DOCUMENTS

| | | | |
|---|---|---|---|
| 2012/0103935 A1* | 5/2012 | Cheng | H01L 21/0337 216/37 |
| 2014/0060736 A1 | 3/2014 | Millward et al. | |
| 2014/0127456 A1* | 5/2014 | Regner | B05D 1/34 428/120 |
| 2014/0353800 A1* | 12/2014 | Guillorn | H01L 21/3086 257/618 |
| 2015/0021295 A1* | 1/2015 | Yoshikawa | G03F 7/0002 216/66 |
| 2015/0179434 A1* | 6/2015 | Ban | H01L 21/0271 428/179 |
| 2015/0325450 A1* | 11/2015 | Abdallah | H01L 21/30625 438/692 |

\* cited by examiner

METHODS OF FORMING PATTERNS HAVING DIFFERENT SHAPES

CROSS-REFERENCE TO RELATED APPLICATION

The present application claims priority under 35 U.S.C 119(a) to Korean Application No. 10-2015-0028623, filed on Feb. 27, 2015, in the Korean Intellectual Property Office, which is incorporated herein by reference in its entirety.

BACKGROUND

1. Technical Field

Various embodiments of the present disclosure relate to methods of fabricating semiconductor devices and, more particularly, to methods of forming patterns having different shapes.

2. Related Art

In the fabrication of semiconductor devices, a lot of effort has been focused on integrating more patterns in a limited semiconductor substrate area. That is, attempts to increase the integration density of the semiconductor devices have typically resulted in formation of finer patterns. Various techniques have been proposed to form fine patterns, such as small contact holes having nano-scale critical dimensions (CD).

The patterns in semiconductor devices are formed using a photolithography process. However, due to image resolution limits in the photolithography process, there are limitations on how small patterns may be formed. Methods of forming fine patterns using self-assembling polymer molecules is a candidate for overcoming the image resolution limits, which are due to the nature of optical systems used in the photolithography process and the wavelengths of light generated from light sources of the optical systems. However, there may still be limitations in simultaneously forming fine patterns having different shapes on a substrate using directed self-assembly of polymer molecules. Accordingly, various techniques have been developed to overcome these difficulties.

SUMMARY

Various embodiments are directed to methods of forming patterns having different shapes.

According to an embodiment, there is provided a method of forming patterns. The method includes forming pillars and first peripheral patterns on an underlying layer, the first peripheral patterns providing first openings therebetween, forming a separation wall layer on the underlying layer to cover sidewalls of the pillars and sidewalls of the first peripheral patterns, forming blocking portions on the separation wall layer to fill first gap regions in first openings, forming a block copolymer layer on the separation wall layer to fill second gap regions between the pillars, annealing the block copolymer layer to form first domains and a second domain surrounding the first domains from the block copolymer layer, the second domain isolating the first domains from each other, selectively removing the first domains to expose portions of the separation wall layer and selectively removing the exposed portions of the separation wall layer to form second openings, removing the second domain and the blocking portions, removing the pillars and the first peripheral patterns to form third openings and fourth openings, and patterning the underlying layer to form fifth openings that extend from the second and third openings and sixth openings that extend from the fourth openings. The fifth and sixth openings are formed to penetrate the underlying layer.

According to an embodiment, there is provided a method of forming patterns. The method includes forming pillars and first peripheral patterns on an underlying layer, the first peripheral patterns providing first openings therebetween, forming a separation wall layer on the underlying layer to cover sidewalls of the pillars and sidewalls of the first peripheral patterns, forming a block copolymer layer on the separation wall layer to fill second gap regions between the pillars, annealing the block copolymer layer to form first domains and a second domain surrounding the first domains from the block copolymer layer, the second domain isolating the first domains from each other, selectively removing the first domains to expose portions of the separation wall layer and selectively removing the exposed portions of the separation wall layer to form second openings, and forming a sacrificial layer that fills the second gap regions between the pillars and first gap regions in the first openings. The sacrificial layer, the separation wall layer, the pillars and the first peripheral patterns are etched back to expose the separation wall layer, the pillars and the first peripheral patterns, etching back the sacrificial layer, the separation wall layer, the pillars and the first peripheral patterns to expose the separation wall layer, the pillars and the first peripheral patterns, selectively removing the sacrificial layer, the exposed pillars and the exposed first peripheral patterns to form third openings provided by removal of the exposed pillars and fourth openings provided by removal of the exposed first peripheral patterns, patterning the underlying layer using the exposed separation wall layer as an etch mask to form fifth openings that extend from the second and third openings and sixth openings that extend from the fourth openings. The fifth and sixth openings are formed to penetrate the underlying layer.

According to an embodiment, there is provided a method of forming patterns. The method includes forming pillars and a peripheral pattern on an underlying layer, forming a separation wall layer on the underlying layer to cover sidewalls of the pillars and sidewalls of the peripheral pattern, forming a blocking portion on a portion of the separation wall layer overlapping with a first portion of the peripheral pattern, forming a block copolymer layer on the separation wall layer to fill gap regions between the pillars, and annealing the block copolymer layer to form first domains and a second domain surrounding the first domains from the block copolymer layer, the second domain isolating the first domains from each other, selectively removing the first domains to expose portions of the separation wall layer and selectively removing the exposed portions of the separation wall layer to form second openings, removing the blocking portion, removing the pillars and a second portion of the peripheral pattern to form third openings and a fourth opening, respectively, and patterning the underlying layer to form fifth openings that extend from the second and third openings and a sixth opening that extends from the fourth opening. The fifth and sixth openings are formed to penetrate the underlying layer.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
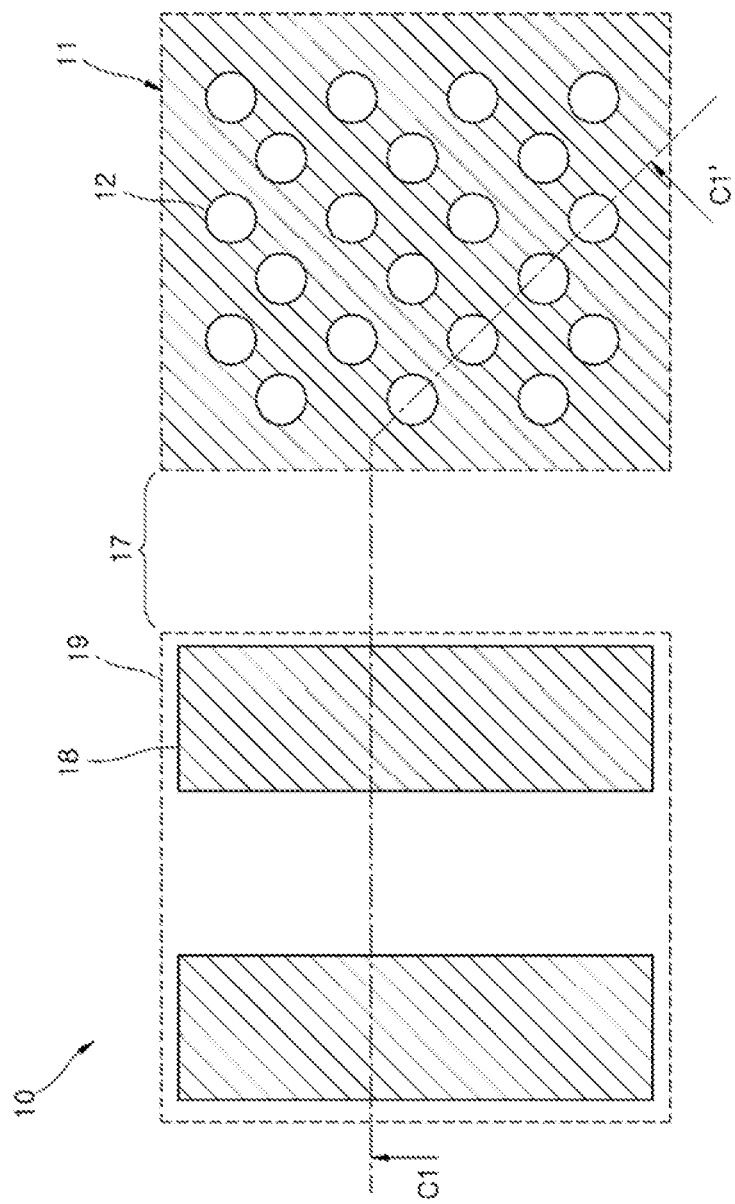
FIGS. 1, 2 and 3 are plan views illustrating a process for obtaining a layout of guide patterns used in a method of forming patterns according to an embodiment.

It will be understood that although the terms such as first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under", "beneath," "below", "lower," "over", "above," "upper" "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for describing particular embodiments only and are not intended to limit the scope of the present disclosure. Other words used to describe the relationship between elements or layers should be interpreted in a like fashion (e.g., "between" versus "directly between" or "adjacent" versus "directly adjacent").

In the following embodiments the term "dense patterns" may be used to describe patterns having a relatively small pitch size and a relatively short distance therebetween, and the term "peripheral patterns" may be used to describe patterns having a relatively large pitch size and a relatively long distance therebetween and may be disposed in a region different from where the dense patterns are disposed. In addition, the term "regularly arrayed patterns" may be used to describe patterns arrayed to have a uniform pitch size and substantially the same distance therebetween, and the term "irregularly arrayed patterns" may be used to describe patterns arrayed to have non-uniform pitch sizes or different distances therebetween. The term "irregularly arrayed patterns" may also be used to describe patterns randomly arrayed without any regularity.

Some embodiments of the present disclosure may provide methods of forming fine patterns having a line width less than a resolution limit of exposure apparatuses using a phase separation of a block copolymer (BCP) layer. For example, some embodiments of the present disclosure may provide methods of forming an array of contact holes or an array of cutting holes for cutting line-shaped patterns using a direct self-assembly (DSA) technique of a BCP layer. Specific polymer blocks constituting a BCP layer may be rearranged and phase-separated from a matrix thereof to form domain portions under a specific condition, and one of the phase-separated domain portions may be selectively removed to form spaces or patterns having a nano-scale feature size. The nano-scale feature size may be from a few to tens of nanometers.

A self-assembled structure of the BCP layer may be formed to have a cylindrical shape or a lamellar shape depending on volume ratio, molecular size, or molecular weight of two or more distinct polymer blocks constituting the BCP layer, and an annealing temperature for the phase separation of the BCP layer. That is, the domain portions of the polymer blocks, which are phase-separated, may be formed to have a cylindrical shape or a lamellar shape. If the self-assembled structure of the BCP layer has a cylindrical shape, the self-assembled structure may be used to form a hole array pattern. If the self-assembled structure of the BCP layer has a lamellar shape, the self-assembled structure may be used to form line and space patterns.

Various embodiments of the present disclosure may be applied to fabrication of highly integrated semiconductor devices, for example, dynamic random access memory (DRAM) devices, phase-change random access memory (PCRAM) devices or resistive random access memory (ReRAM) devices. In addition, the following embodiments may be applied to fabrication of memory devices such as static random access memory (SRAM) devices, flash memory devices, magnetoresistive random access memory (MRAM) devices or ferroelectric random access memory (FeRAM) devices. The following embodiments may also be applied to fabrication of logic devices such as control devices, central processing units (CPU) or arithmetic logic units ALU).

Figure 2:
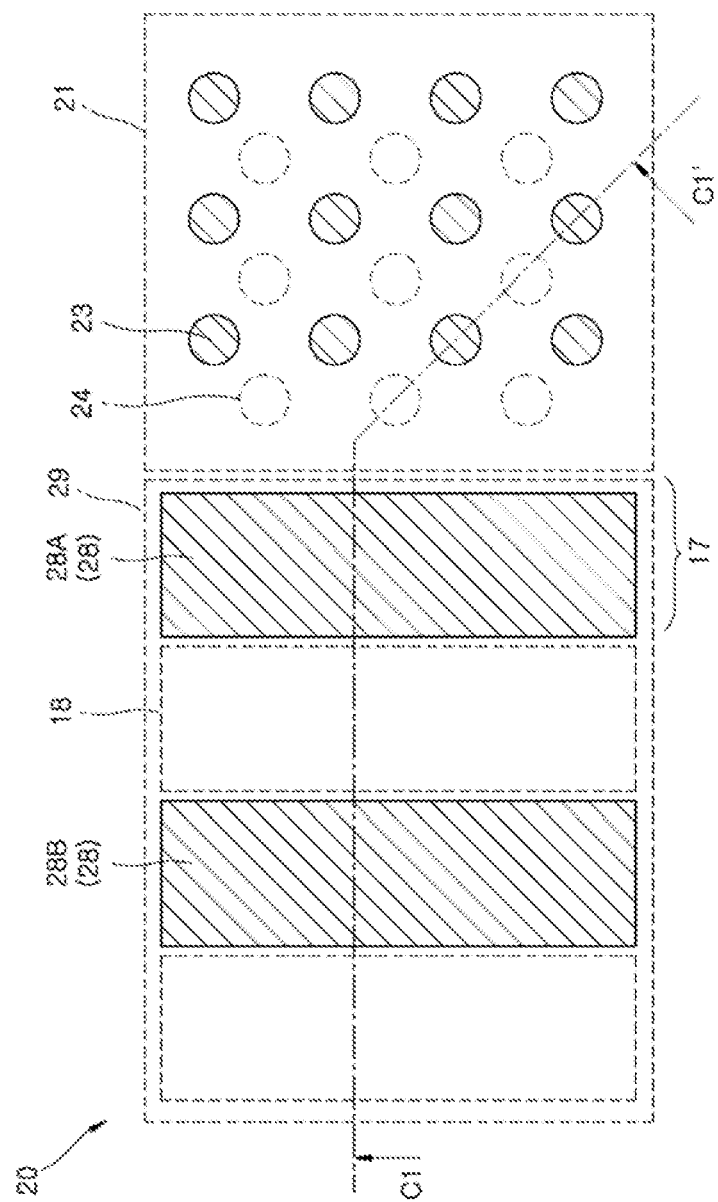
Figure 3:
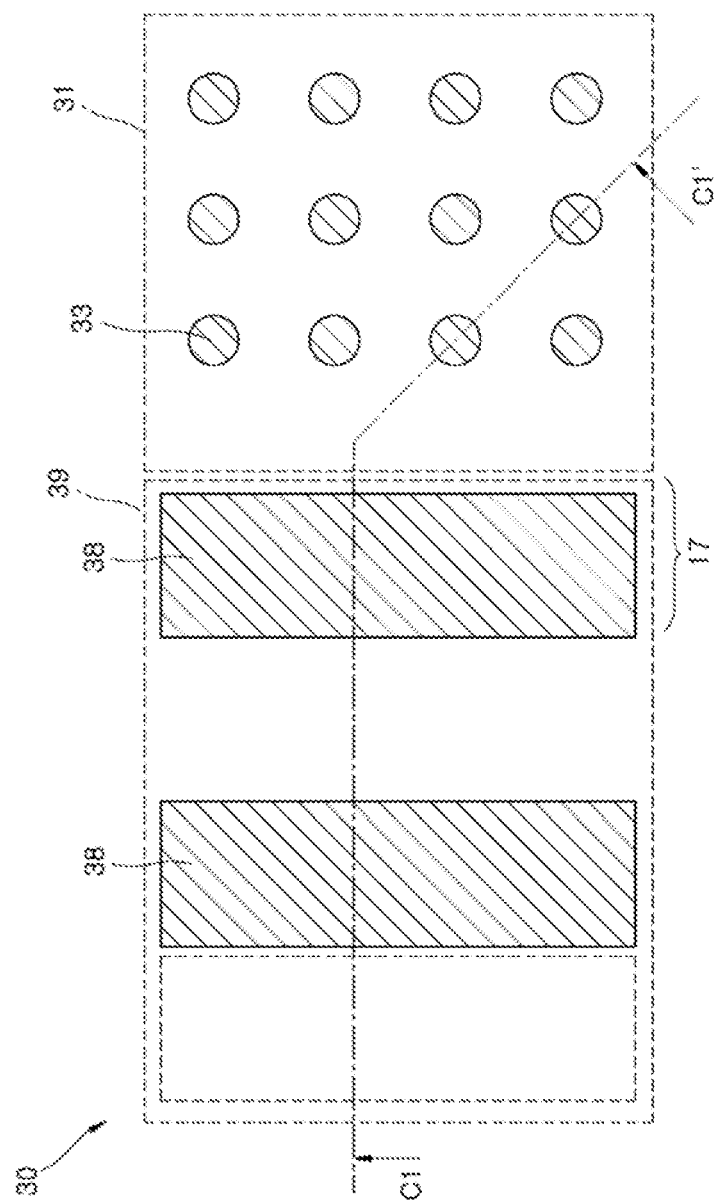

FIGS. 1, 2 and 3 are plan views illustrating a process for obtaining a layout of guide patterns used in methods of forming patterns according to an embodiment.

Referring to FIG. 1, a layout 10 having target patterns may include a first region 11 and a second region 19. First target patterns 12, for example, fifth opening portions are arrayed in the first region 11 and second target patterns 18, for example, second peripheral patterns are arrayed in the second region 19. The first target patterns 12 and the second target patterns 18 may correspond to final patterns formed on a substrate. The second region 19 is distinct from and adjacent to the first region 11. The first region 11 may correspond to a cell region in which dense patterns are formed, and the second region 19 may correspond to a peripheral region in which line-shaped patterns or polygon-shaped patterns are formed. A boundary region 17 may be disposed between the first region 11 and the second region 19. The boundary region 17 may be a blank region in which no patterns are formed.

Referring to FIG. 2, a layout 20 may include a first region 21 in which pillar-shaped patterns 23 corresponding to some of the first target patterns 12 shown in FIG. 1 and first domain patterns 24 of a BCP layer disposed between the pillar-shaped patterns 23 and corresponding to the others of the first target patterns 12 shown in FIG. 1 are arrayed. The pillar-shaped patterns 23 may constitute some of the guide patterns. Each of the first domain patterns 24 may be formed at a central portion of a region surrounded by four adjacent ones of the pillar-shaped patterns 23 when the BCP layer phase-separated. Thus, a layout of the pillar-shaped patterns 23 may be obtained by removing the first domain patterns 24 from the first region 21.

The layout 20 may include a layout of third target patterns 28 disposed in a second region 29, and the layout of the third target patterns 28 may be an inversion (i.e., a reverse image) of the layout of the second target patterns 18 shown in FIG. 1. The third target patterns 28 may include a first pattern 28A and a second pattern 28B between which the second target patterns 18 are provided. The first pattern 28A of the third target patterns 28 may be designed to have an outline including the boundary region 17.

Referring to FIG. 3, a layout 30 of the guide patterns may include pillar patterns 33 disposed in a first region 31 and third target patterns 38 disposed in a third region 39 other than the first region 31. The third target patterns 38 may be layout patterns for forming first peripheral patterns that act as templates for providing second peripheral patterns. The third region 39 may include the second region 19 and the boundary region 17 shown in FIG. 1.

FIGS. 4 to 19 are cross-sectional views taken along lines C1-C1' of FIGS. 1, 2 and 3 to illustrate a method of forming patterns according to an embodiment.

Figure 4:
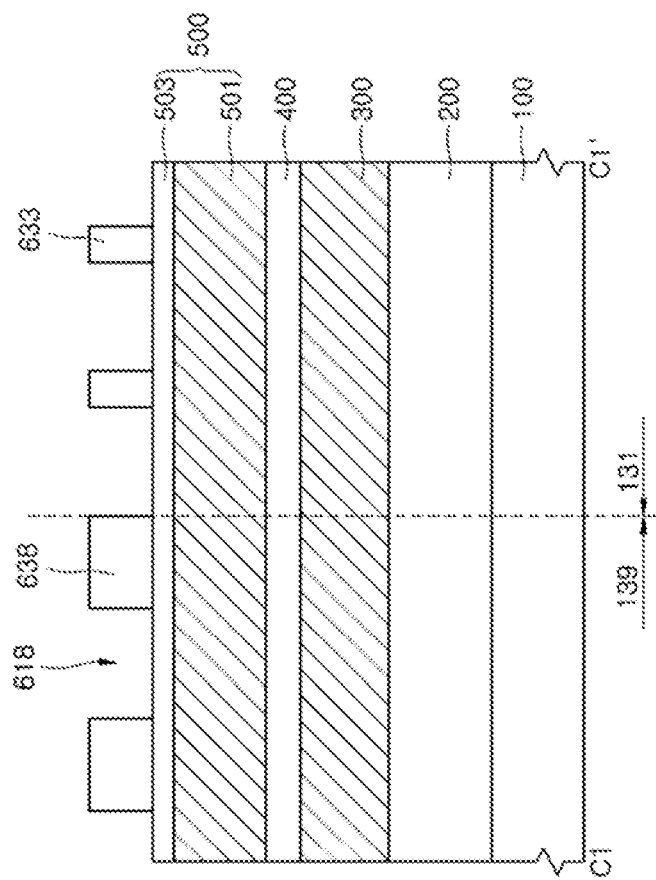
FIGS. 4 to 19 are cross-sectional views illustrating a method of forming patterns according to an embodiment.

FIG. 4 illustrates a step of forming mask patterns 633 and 638 on a guide layer 500.

Referring to FIG. 4, the mask patterns 633 and 638 may be formed on the guide layer 500. The mask patterns 633 and 638 may be used as etch masks when the guide layer 500 is patterned in a subsequent etch process. The mask patterns 633 and 638 may include first patterns 633 corresponding to the pillar patterns 33 of FIG. 3 and second patterns 638 corresponding to the third target patterns 38 of FIG. 3. Space regions 618 between the second patterns 638 may correspond to openings that have the shape of the second target patterns 18 of FIG. 1 in a plan view. The mask patterns 633 and 638 may include a photoresist material. Before the mask patterns 633 and 638 are formed, a bottom anti-reflective coating (BARC) layer (not shown) may be additionally formed on the guide layer 500 to suppress irregular reflection of light during an exposure step for forming the mask patterns 633 and 638.

In a subsequent process, the guide layer 500 may be patterned to form guide patterns (for example, guide patterns shown in FIG. 3) for defining positions of domain portions which are generated while a BCP layer is phase-separated. The guide layer 500 may be formed on a semiconductor substrate 100. The semiconductor substrate 100 may include a first region 131 in which the pillar patterns 33 of FIG. 3 are densely disposed and a second region 139 in which the second target patterns 18 of FIG. 1 are disposed. The guide layer 500 may be formed on an underlying layer 400 which is disposed on the semiconductor substrate 100. The guide layer 500 may include a first guide layer 501. The first guide layer 501 may be formed of a spin-on-carbon (SOC) layer having a thickness of about 700 to 800 angstroms. The guide layer 500 may further include a second guide layer 503. The second guide layer 503 may be formed on the first guide layer 501 to act as a capping layer. The second guide layer 503 may be formed of a silicon oxynitride (SiON) layer having a thickness of about 300 angstroms.

In a subsequent process, the underlying layer 400 may be patterned to form underlying patterns used as a portion of a hard mask or used to pattern another hard mask. For example, the underlying layer 400 may correspond to any one of a plurality of layers constituting a multi-layered hard mask system, A first etch target layer 200 and a second etch target layer 300 may be sequentially formed on the semiconductor substrate 100 before the underlying layer 400 is formed. The first etch target layer 200 or the second etch target layer 300 may also be used as one of the plurality of layers constituting the multi-layered hard mask system or may be selectively etched using the multi-layered hard mask system in a subsequent process.

The first etch target layer 200 may include a polysilicon layer having a thickness of about 600 angstroms. Alternatively, the first etch target layer 200 may be formed of an insulation layer such as a silicon oxide layer. The second etch target layer 300 may be formed on the first etch target layer 200 to include an amorphous SOC layer having a thickness of about 730 to 1000 angstroms. In some embodiments, the underlying layer 400 may be formed on the second etch target layer 300 to include a silicon oxynitride (SiON) layer having a thickness of about 300 to 350 angstroms.

Figure 5:
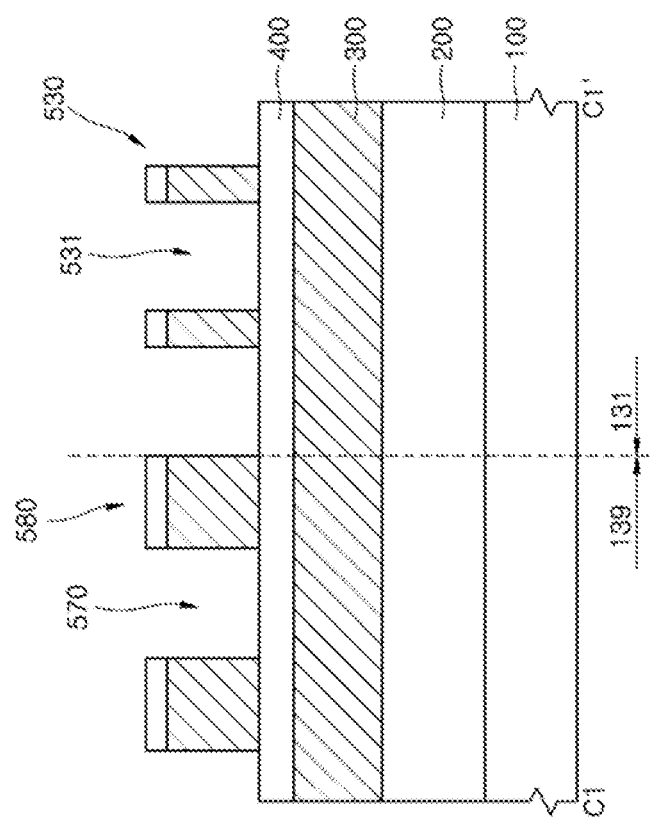

FIG. 5 illustrates a step of forming an array of pillars 530 and first peripheral patterns 580.

Referring to FIG. 5, the guide layer 500 may be etched using the mask patterns 633 and 638 as etch masks, thereby forming the array of the pillars 530 and the first peripheral patterns 580. The array of the pillars 530 may be formed on the first region 131 of the semiconductor substrate 100, and the first peripheral patterns 580 may be formed on the second region 139 of the semiconductor substrate 100. Space regions between the first peripheral patterns 580 may correspond to first openings 570. The first openings 570 may have substantially the same shape as the second target patterns 18 of FIG. 1 in a plan view.

The pillars 530 may be arrayed so that four adjacent pillars 530 are respectively located at four vertices of a tetragon in a plan view. For example, the pillars 530 may be formed to be respectively located at cross points of rows and columns in a plan view. In some embodiments, the pillars 530 may be arrayed so that three adjacent ones among the pillars 530 are respectively located at three vertices of a triangle in a plan view. The pillars 530 may be arrayed so that gap regions 531 are disposed between the pillars 530 arrayed in each diagonal line that is parallel with a line C1-C1' of the first region 131 in a plan view. As illustrated in FIG. 3, the pillar patterns 33 corresponding to the pillars 530 may be disposed so that a distance between the pillar patterns 33 arrayed in each row or in each column is less than a distance between the pillar patterns 33 arrayed in a diagonal line (i.e., the line C1-C1' in the first region 31). The pillars 530 may be used as guide patterns inducing self-assembly of a BCP layer in a subsequent process.

Figure 6:
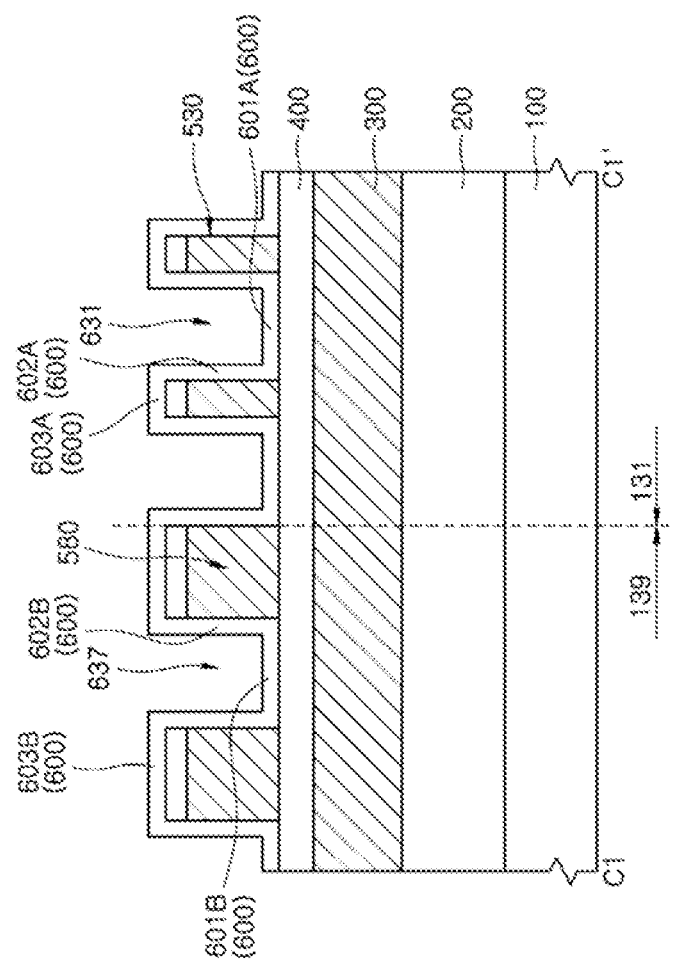

FIG. 6 illustrates a step of forming a separation wall layer 600.

Referring to FIG. 6, the separation wall layer 600 may include first separation walls 602A covering sidewalls of the pillars 530 and second separation walls 602B covering sidewalls of the first openings 570. The separation wall layer 600 may further include first extensions 601A covering the underlying layer 400 on the first region 131 and second extensions 603A covering top surfaces of the pillars 530. In addition, the separation wall layer 600 may further include third extensions 601B covering the underlying layer 400 on the second region 139 and fourth extensions 603B covering top surfaces of the first peripheral patterns 580.

The separation wall layer 600 may be formed to have grooves that provide gap regions 631 between the pillars 530 and gap regions 637 in the first openings 570. The separation wall layer 600 ay be formed of an insulation material having an etch selectivity with respect to the pillars 530 and the underlying layer 400. For example, the separation wall layer 600 may be formed of an ultra-low temperature oxide (ULTO) layer having a thickness of about 200 angstroms.

Figure 7:
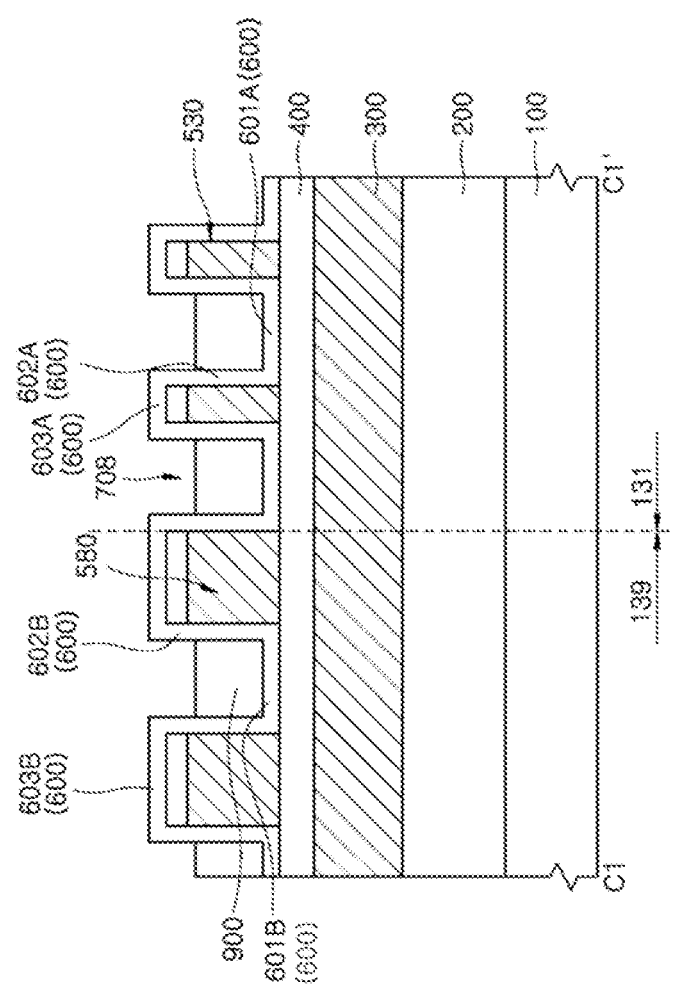

FIG. 7 illustrates a step of forming blocking portions 900.

Referring to FIG. 7, the blocking portions 900 may be formed to cover the separation wall layer 600. The blocking portions 900 may be formed to fill the gap regions 637 in the first openings 570 and the gap regions 631 between the pillars 530. In some embodiments, the blocking portions 900 may be formed to partially fill the gap regions 631 and 637.

In such case, the second and fourth extensions 603A and 603B may be exposed. Thus, the blocking portions 900 may be formed to have top surfaces that are lower than top surfaces of the second and fourth extensions 603A and 603B. Accordingly, the blocking portions 900 may be formed to provide grooves thereon. The blocking portions 900 may be formed to fill lower half portions of the gap regions 631 and 637, respectively. Thus, seventh openings 708 may be provided on the blocking portions 900, respectively. Therefore, upper portions of the first and second separation walls 602A and 602B of the separation wall layer 600 may be exposed by the seventh openings 708. The blocking portions 900 may be formed by depositing or coating an organic material such as a BARC material. Alternatively, the blocking portions 900 may be formed by depositing or coating an organic material to form an organic layer and by recessing the organic layer to provide the seventh openings 708.

Figure 8:
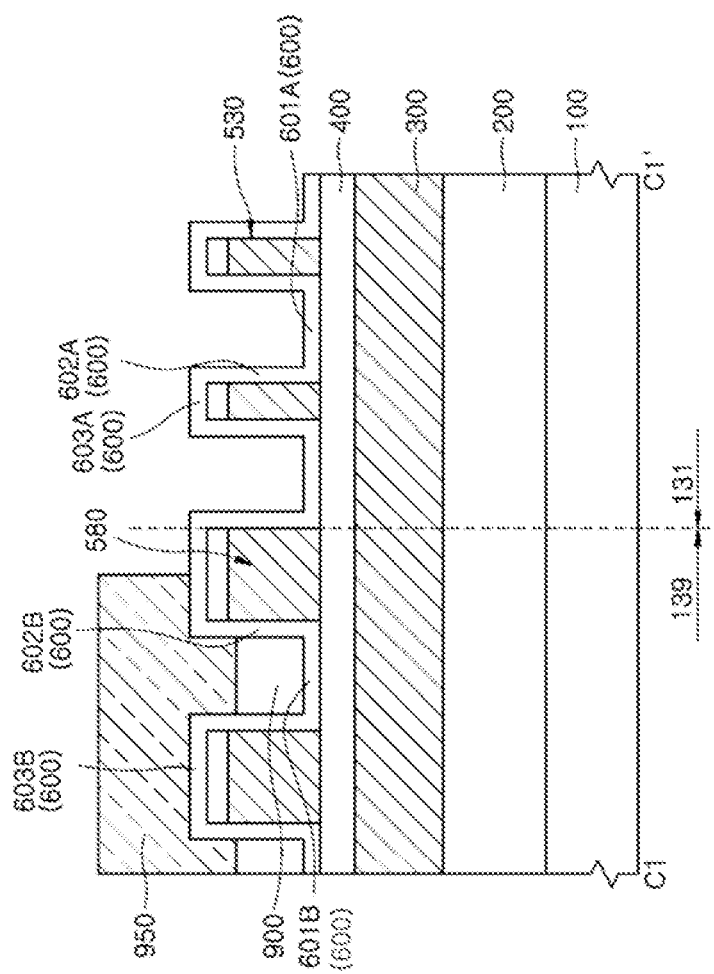

FIG. 8 illustrates a step of removing some of the blocking portions 900.

Referring to FIG. 8, a mask 950 may be formed on the separation wall layer 600 to cover the blocking portions 900 on the second region 139 of the semiconductor substrate 100 and to expose the blocking portions 900 on the first region 131 of the semiconductor substrate 100. The mask 950 may include a photoresist material. The blocking portions 900 exposed though the mask 950 may be selectively removed to expose the separation wall layer 600 providing the gap regions 631 between the pillars 530. Accordingly, only the blocking portions 900 filling the gap regions 637 in the first openings 570 may remain. The mask 950 may be removed after the blocking portions 900 exposed through the mask 950 are selectively removed.

Figure 9:
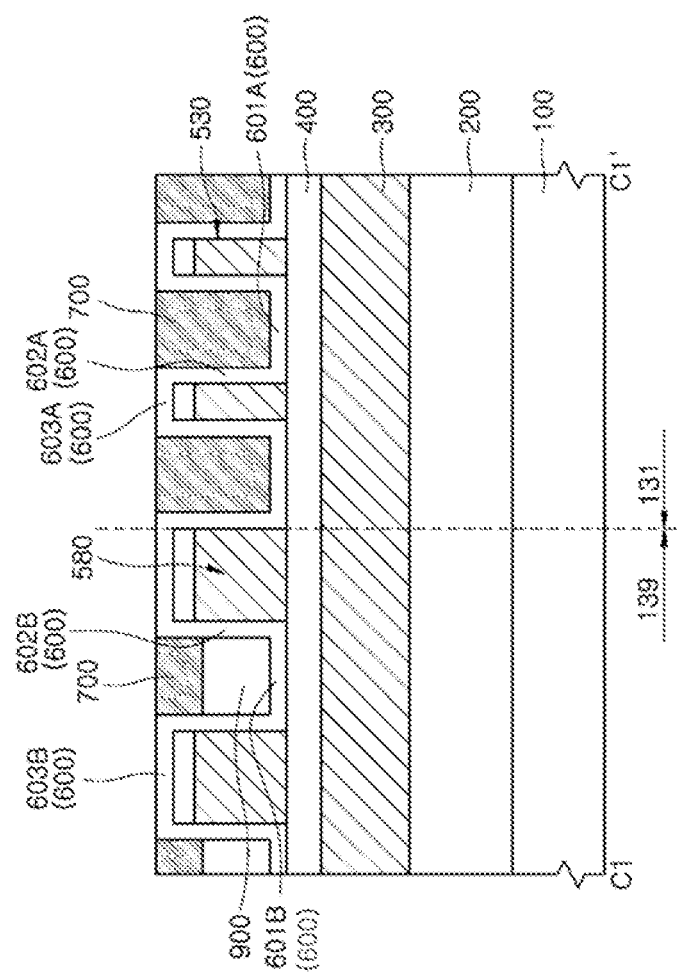

FIG. 9 illustrates a step of forming a BCP layer 700.

Referring to FIG. 9, the BCP layer 700 may be formed to fill the gap regions 631 provided by the separation wall layer 600 between the pillars 530. The BCP layer 700 may also be formed to fill the seventh openings 708 provided on the blocking portions 900 remaining on the second region of the semiconductor substrate 100. The BCP layer 700 may include block copolymer materials such as polystyrene-poly (methyl methacrylate) (PS-b-PMMA) or polystyrene-poly (dimethyl siloxane) (PS-PDMS). In the event that the BCP layer 700 is formed of a PS-b-PMMA material including PS blocks and PMMA blocks, a volume ratio of the PS blocks to the PMMA blocks may be controlled to be within the range of about 7:3 to about 5:5. The volume ratio of the PS blocks to the PMMA blocks or molecular weights of the PS block and the PMMA block may be appropriately controlled according a process scheme. For example, the PS-b-PMMA material may have a PS block content of about 60 to 80 vol % and a PMMA block content of about 20 to 40 vol %.

Figure 20:
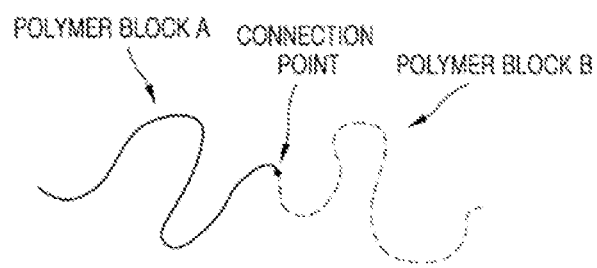
FIGS. 20, 21 and 22 are schematic views illustrating phase separations of block copolymer (BCP) layers used in some embodiments.
Figure 21:
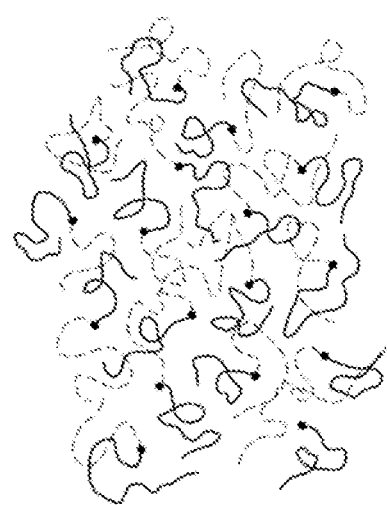
Figure 22:
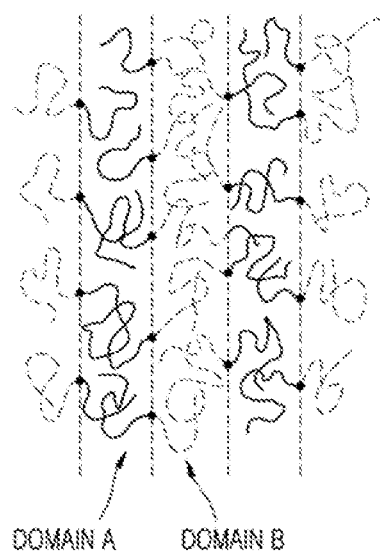

The BCP layer 700 may be a functional polymer material where two or more polymer blocks having distinct structures are combined with each other by a covalent bond to constitute a single block copolymer material, as illustrated in FIG. 20. FIGS. 20, 21 and 22 are schematic views illustrating phase separations of BCP layers used in some embodiments. As illustrated in FIG. 20, the BCP layer 700 may have a chain shape in which a polymer block A and a polymer block B are connected to each other by a covalent bond through a connection point. The BCP layer 700 may be coated to have a homogeneous phase, as illustrated in FIG. 21. The polymer blocks having distinct structures in the BCP layer 700 may have different miscibility and different solubility due to a difference between chemical structures thereof. That is, the polymer blocks having distinct structures are immiscible with each other at a certain temperature. Thus, the BCP layer 700 may be phase-separated using an annealing process to provide a self-aligned structure, as illustrated in FIG. 22. That is, the BCP layer 700 having a homogeneous phase may be phase-separated into a domain 'A' where polymer blocks 'A' are ordered and a domain 'B' where polymer blocks 'B' are ordered, by an annealing process. As such, polymer blocks of the BCP layer 700 may be phase-separated or selectively dissolved in a liquid state or in a solid state to form a self-assembled structure.

Forming a nano-scale structure having a specific shape through a self-assembly of the BCP layer 700 may be influenced by physical and/or chemical properties of the polymer blocks of the BCP layer 700, When a BCP layer consisting of two distinct polymer blocks is self-assembled on a substrate, the self-assembled structure of the BCP layer may be formed to have a three dimensional cubic shape, a three dimensional double helix shape, a two dimensional hexagonal packed column shape, or a two dimensional lamella shape depending on a volume ratio or molecular size of the polymer blocks constituting the BCP layer, and an annealing temperature for phase separation of the BCP layer.

In some embodiments, the BCP layer 700 may be formed of various block copolymers such as polybutadiene-polybutylmethacrylate, polybutadiene-polydimethylsiloxane, polybutadiene-polymethylmethacrylate, polybutadiene-polyvinylpyridine, polybutylacrylate-polymethylmethacrylate, polybutylacrylate-polyvinylpyridine, polyisoprene-polyvinylpyridine, polyisoprene-polymethylmethacrylate, polyhexylacrylate-polyvinylpyridine, polyisobutylene-polybutylmethacrylate, polyisobutylene-polymethylmethacrylate, polobutylene-polybutylmethacrylate, polyisobutylene-polydimethylsiloxane, polybutylmethacrylate-polybutylacrylate, polyethylethylene-polymethylmetacrylate, polystyrene-polybutylmethacrylate, polystyrene-polybutadiene, polystyrene-polyisoprene, polystyrene-polydimethylsiloxane, polystyrene-polyvinylpyridine, polyethylethylene-polyvinylpyridine, polyethylene-polpvinylpyridine, polyvinylpyridine-polymethylmethacrylate, polyethyleneoxide-polyisoprene, polyethyleneoxide-polybutadiene, polyethyleneoxide-polystyrene, polyethyleneoxide-polymethylmethacrylate, polyethyleneoxide-polydimethylsiloxane, or polystyrene-polyethyleneoxide.

Figure 10:
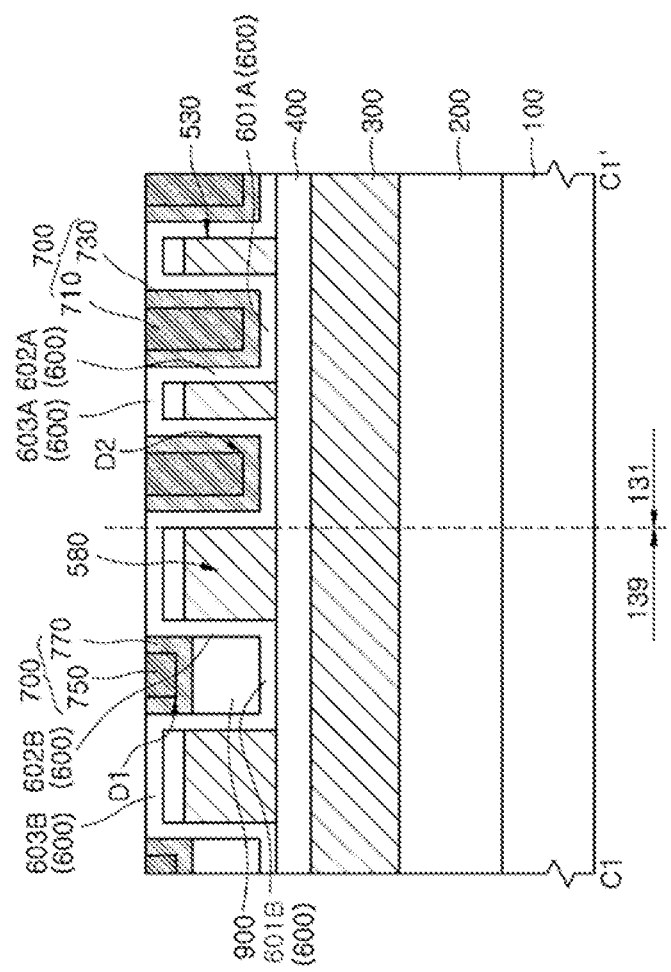

FIG 10 illustrates a step of phase-separating the BCP layer 700.

Referring to FIG. 10, the BCP layer 700 may be phase-separated using an annealing process to form first domains 710 located at central portions of the gap regions 631 between the pillars 530 on the first region 131 of the semiconductor substrate 100 and a second domain 730 surrounding and isolating the first domains 710 from each other. Each of the first domains 710 may fill any one of cylinder-shaped grooves provided by the second domain 730 to have a post shape.

While the BCP layer 700 is phase-separated to form the first domains 710 and the second domain 730, portions of the BCP layer 700 filling the seventh openings 708 provided by the separation wall layer 600 and the blocking portions 900 on the second region 139 of the semiconductor substrate 100 may also be phase-separated to form third domains 750 located in the seventh openings 708 and fourth domains 770 surrounding the third domains 750. Since the seventh openings 708 are shallower than the gap regions 631, the third and fourth domains 750 and 770 may be formed to be shallower than the first and second domains 710 and 730. In some embodiments, while the BCP layer 700 is phase-separated to form the first domains 710 and the second domain 730, portions of the BCP layer 700 filling the seventh openings 708 on the second region 139 of the semiconductor substrate 100 may not be phase-separated. Bottom surfaces of the third domains 750 may be relatively high due to the presence of the blocking portions 900. Thus, a depth D1 of the third domains 750 may be less than a depth of the gap regions 637 of FIG. 6. That is, the depth D1 of the third domains 750 may be less than a depth D2 of the first domains 710.

The phase separation of the BCP layer 700 may be achieved by annealing the BCP layer 700 at a temperature exceeding a glass transition temperature Tg of the BCP layer 700 to rearrange the polymer blocks of the BCP layer 700. For example, the BCP layer 700 may be annealed at a temperature of about 100 to 300 degrees Celsius for about six minutes to about twenty four hours to rearrange the polymer blocks of the BCP layer 700.

Figure 11:
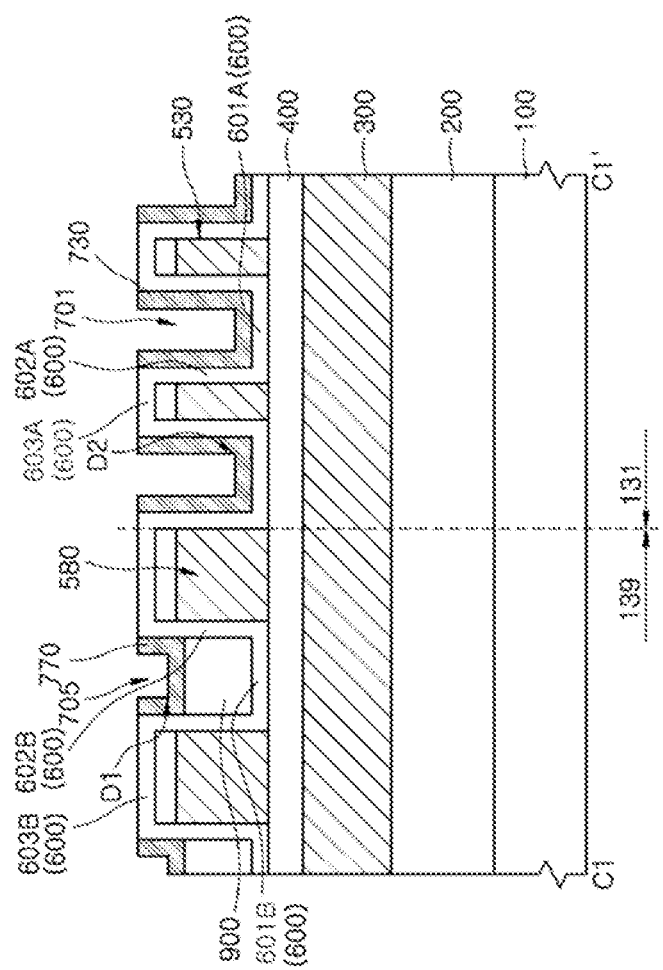

FIG. 11 illustrates a step of forming ninth openings 701 and eighth openings 705.

Referring to FIG. 11, the first domains 710 of FIG. 10 may be selectively removed to form the ninth openings 701 located between the pillars 530, While the first domains 710 of FIG. 10 are selectively removed, the third domains 750 of FIG. 10 may also be removed to form the eighth openings 705 in the first openings 570. In such case, a depth (substantially equal to the depth D1) of the eighth openings 705 may be less than a depth (substantially equal to the depth D2) of the ninth openings 701.

Figure 12:
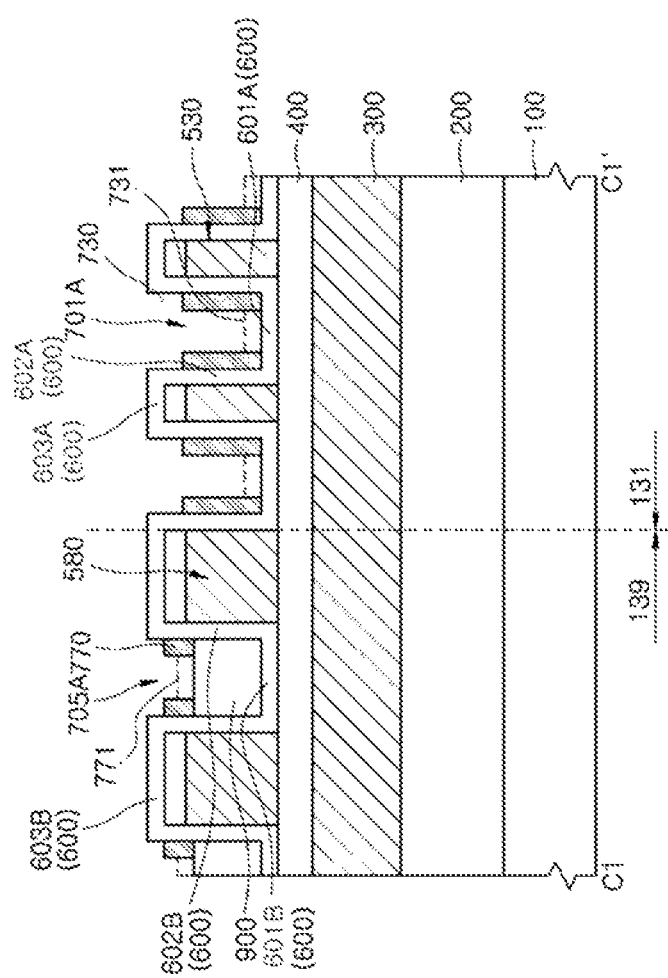

FIG. 12 illustrates a step of forming ninth opening extensions 701A.

Referring to FIG. 12, bottom portions 731 of the second domain 730 exposed by the ninth openings 701 may be selectively removed to form the ninth opening extensions 701A that extend from the ninth openings 701. While the bottom portions 731 of the second domain 730 are removed, bottom portions 771 of the fourth domains 770 exposed by the eighth openings 705 may also be removed to form eighth opening extensions 705A. The ninth opening extensions 701A and the eighth opening extensions 705A may be formed by anisotropically etching the second domain 730 and the fourth domains 770.

Figure 13:
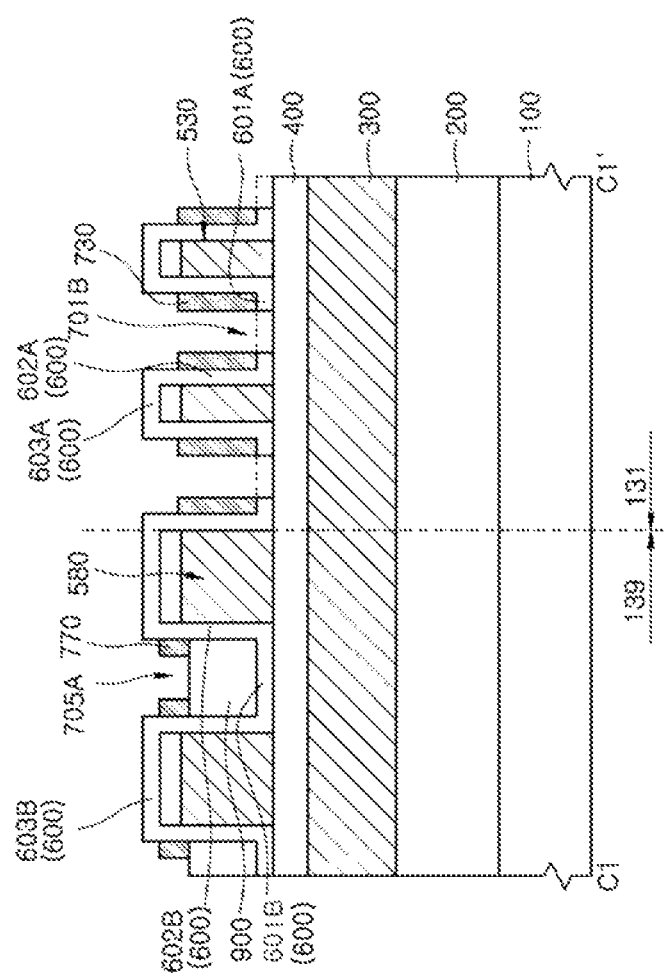

FIG. 13 illustrates a step of forming second openings 701B.

Referring to FIG. 13, the first extensions 601A of the separation wall layer 600 exposed by the ninth opening extensions 701A may be selectively removed to form the second openings 701B. While the first extensions 601A of the separation wail layer 600 are selectively removed, the blocking portions 900 exposed by the eighth opening extensions 705A may be partially etched. However, the blocking portions 900 may prevent the third extensions 601B of the separation wall layer 600 from being etched while the first extensions 601A of the separation wall layer 600 are selectively removed. Accordingly, the eighth opening extensions 705A may not extend into the third extensions 601B of the separation wall layer 600. That is, the blocking portions 900 may act as barrier patterns that prevent the eighth opening extensions 705A from being transferred into the third extensions 601B.

Figure 14:
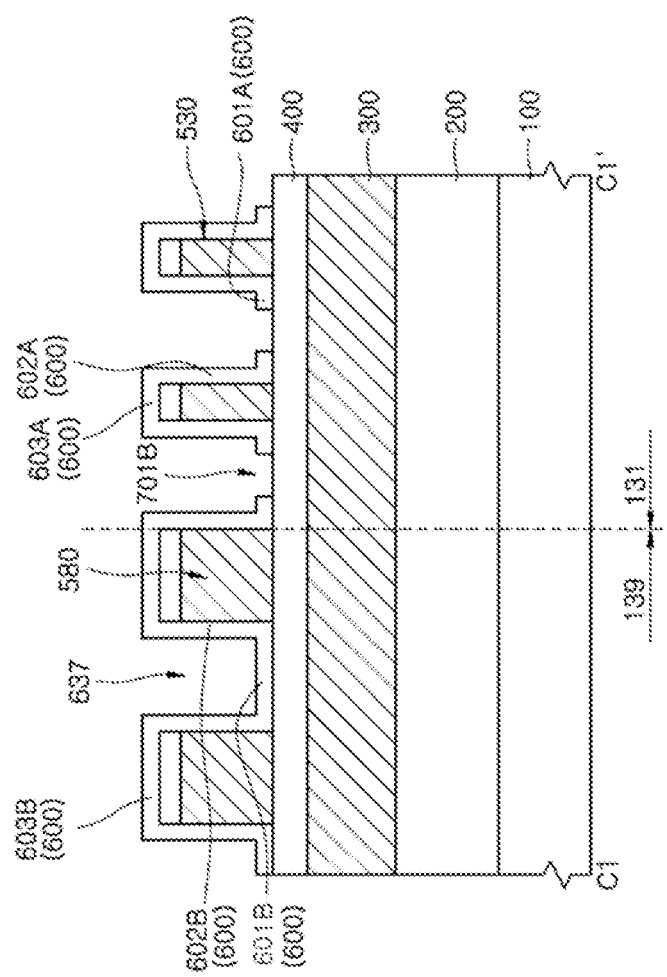

FIG. 14 illustrates a step of selectively removing the blocking portions 900 remaining on the second region 139 of the semiconductor substrate 100.

Referring to FIG. 14, remaining portions of the BCP layer 700, for example, the second domains 730 and the fourth domains 770 may be selectively removed. The blocking portions 900 may also be selectively removed. The second domains 730, the fourth domains 770 and the blocking portions 900 may be removed using a plasma etch process that employs an oxygen gas or a nitrogen gas as a reaction gas. As a result of the removal of the second domains 730, the fourth domains 770 and the blocking portions 900, an entire portion of the separation wall layer 600 providing the second openings 701B may be exposed.

Figure 15:
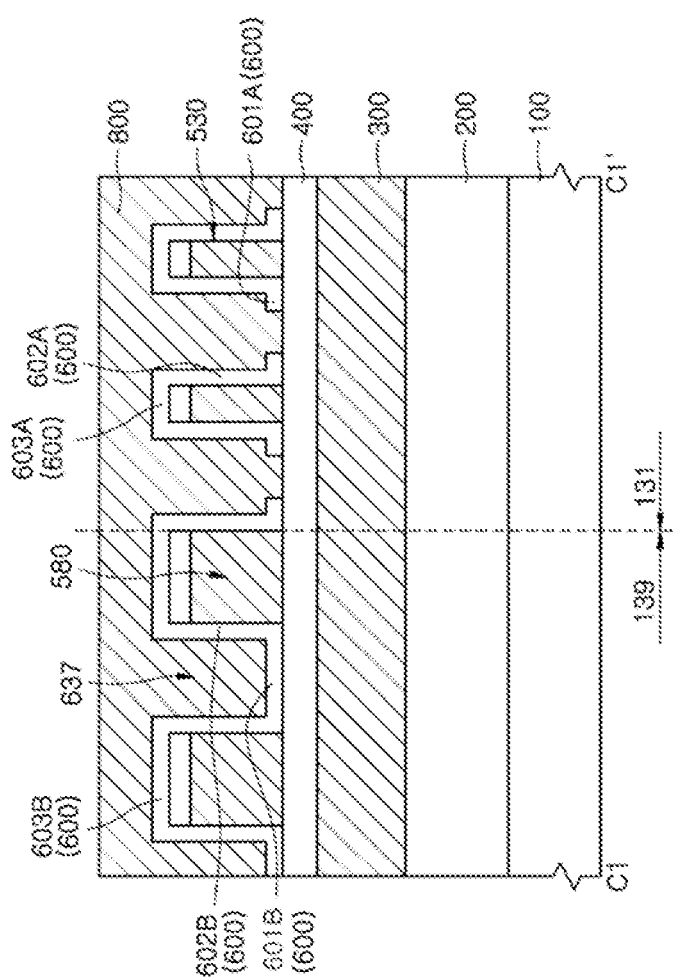

FIG. 15 illustrates a step of forming a sacrificial layer 800.

Referring to FIG. 15 the sacrificial layer 800 may be formed on the separation wall layer 600 and in the second openings 701B. The sacrificial layer 800 may include an organic material, for example, an SOC material or a BARC material. The sacrificial layer 800 may be formed to fill the gap regions 637 in the first openings 570, the gap regions 631 between the pillars 530, and the second openings 701B.

Figure 16:
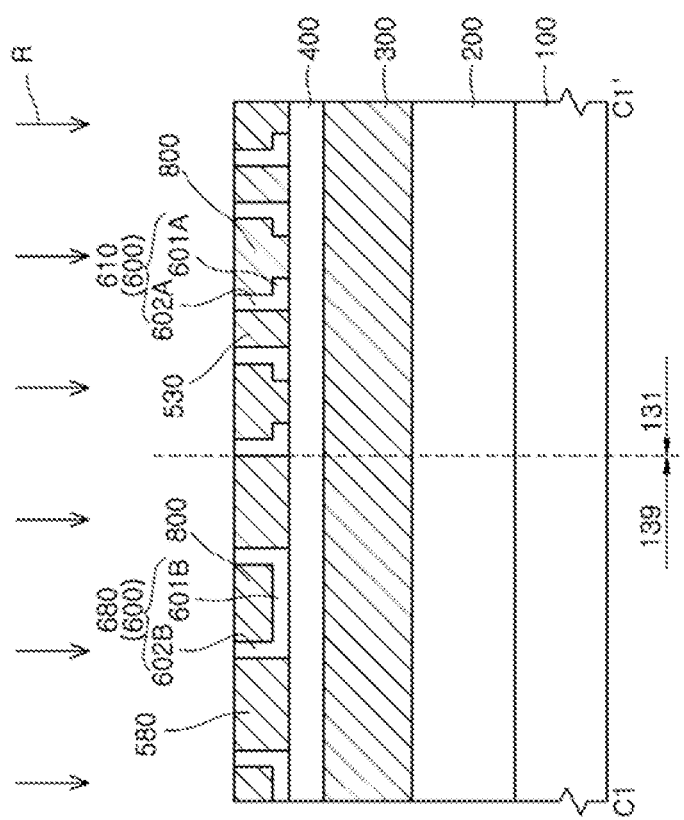

FIG. 16 illustrates a step of recessing the sacrificial layer 800.

Referring to FIG. 16, the sacrificial layer 800 may be recessed using a chemical mechanical polishing (CMP) process or an etch back process, as indicated by arrows 'R'. While the sacrificial layer 800 is recessed, the separation wall layer 600, the pillars 530 and the first peripheral patterns 580 may also be recessed. As a result, second separation wall patterns 680 may be formed between the recessed first peripheral patterns 580, and a first separation wall pattern 610 may be formed between the recessed pillars 530. Each of the second separation wall patterns 680 may include the pair of second separation walls 602B and the third extension 601B between the pair of second separation walls 602B to have a "U"-shaped cross-section. The first separation wall pattern 610 may include the first separation wall 602A surrounding sidewalls of the recessed pillars 530 and the first extensions 601A laterally extending from lower portions of the first separation wall 602A to provide the second openings 701B.

Figure 17:
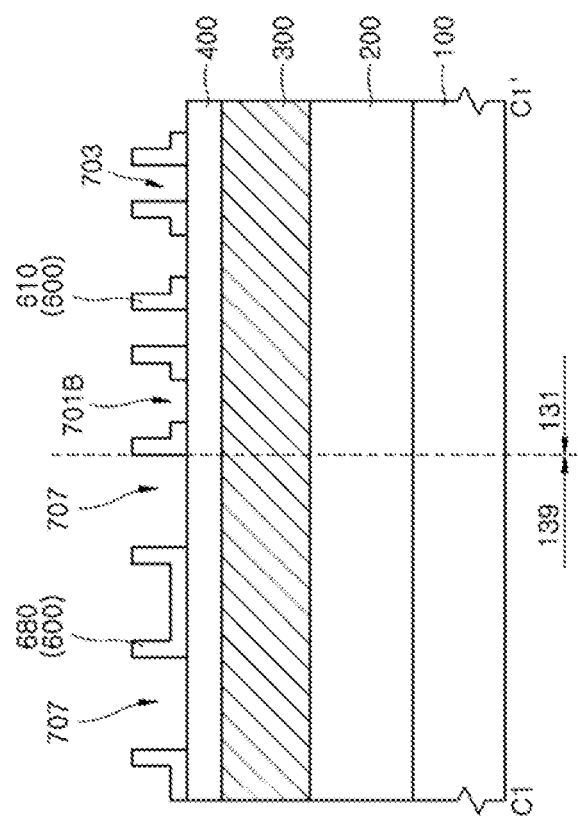

FIG. 17 illustrates a step of selectively removing the recessed pillars 530, the recessed first peripheral patterns 580, and the recessed sacrificial layer 800.

Referring to FIG. 17, the recessed pillars 530, the recessed first peripheral patterns 580, and the recessed sacrificial layer 800 may be selectively removed to expose the first separation wall pattern 610 and the second separation wall patterns 680. The recessed pillars 530, the recessed first peripheral patterns 580, and the recessed sacrificial layer 800 may be removed using an oxygen plasma etch process. The first separation wall pattern 610 may provide the second openings 701B, and the recessed pillars 530 may be removed to provide third openings 703. The recessed first peripheral patterns 580 may be removed to provide fourth openings 707.

Figure 18:
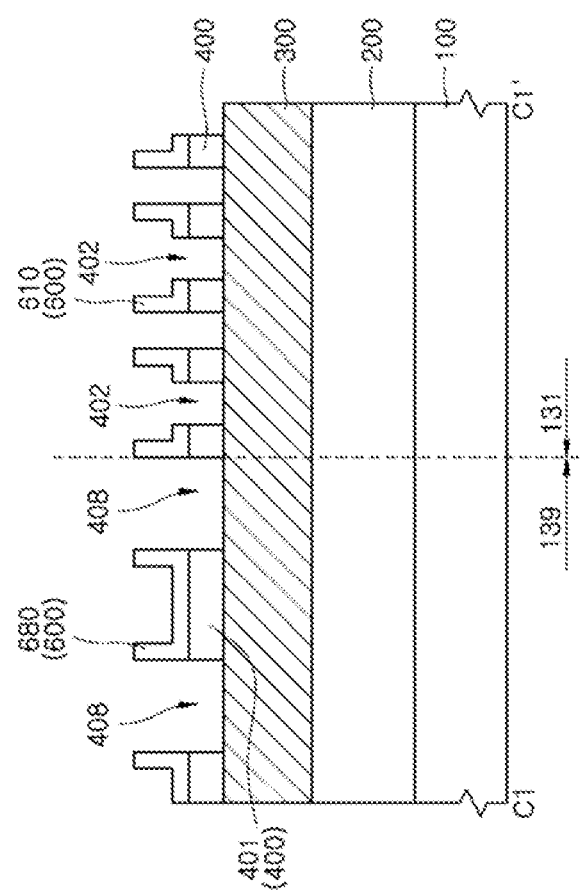

FIG. 18 illustrates a step of forming fifth openings 402 and sixth openings 408.

Referring to FIG. 18, the underlying layer 400 on the first region 131 of the semiconductor substrate 100 may be etched using the first separation wall pattern 610 as an etch mask, thereby forming the fifth openings 402. The fifth openings 402 may be formed to penetrate the underlying layer 400.

During the etch process for forming the fifth openings 402, the underlying layer 400 on the second region 139 of the semiconductor substrate 100 may also be etched using the second separation wall patterns 680 as etch masks, thereby forming the sixth openings 408. Portions 401 of the underlying layer 400 remaining below the second separation wall patterns 680 may correspond to second peripheral patterns. The second peripheral patterns 401 may have substantially the same shape as the second target patterns 18 illustrated in FIG. 1 in a plan view.

Figure 19:
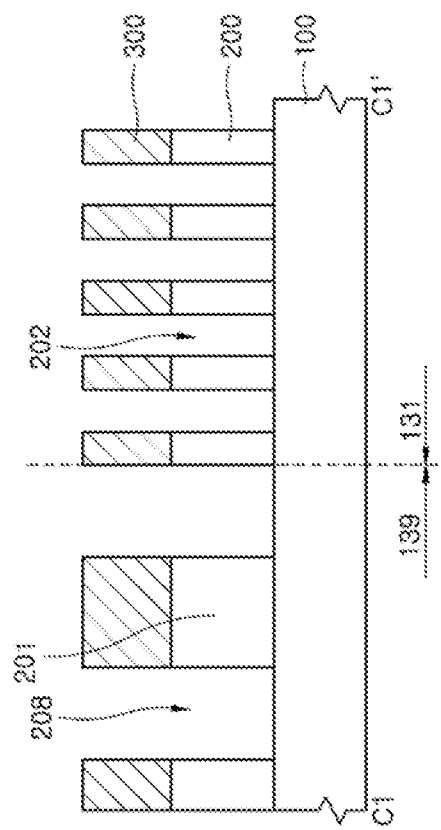

FIG. 19 illustrates a step of forming fifth opening extensions 202 and sixth opening extensions 208.

Referring to FIG. 19, the second etch target layer 300 and the first etch target layer 200 may be etched using the underlying layer 400 providing the fifth and sixth openings 402 and 408 of FIG. 18 as an etch mask. As a result, the sixth opening extensions 208 may be formed to penetrate the first and second etch target layers 200 and 300 on the second region 139 of the semiconductor substrate 100, and the fifth opening extensions 202 may be formed to penetrate the first and second etch target layers 200 and 300 on the first region 131 of the semiconductor substrate 100. That is, the first and second etch target layers 200 and 300 may be patterned to provide the fifth opening extensions 202 arrayed on the first region 131 of the semiconductor substrate 100 and the sixth opening extensions 208 arrayed on the second region 139 of the semiconductor substrate 100. In such case, portions 201 of the first etch target layer 200 remaining below the second peripheral patterns 401 of FIG. 18 may have substantially the same shape as the second target patterns 18 illustrated in FIG. 1 in a plan view. After formation of the fifth and sixth opening extensions 202 and 208, the first and second separation wall patterns 610 and 680 and the underlying layer 400 may be removed.

Figure 23:
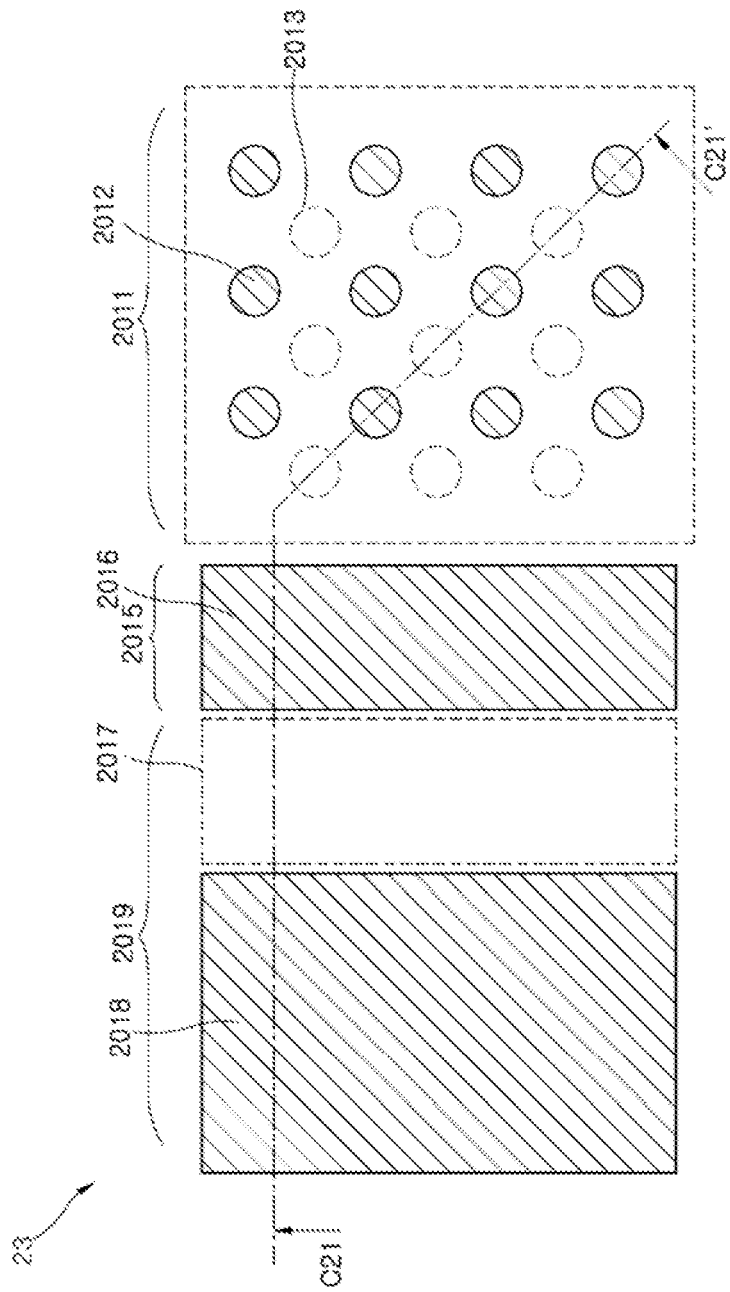
FIG. 23 is a plan view illustrating a layout of guide patterns used in a method of forming patterns according to another embodiment.

FIG. 23 is a plan view illustrating a layout 23 of guide patterns used in a method of forming patterns according to another embodiment.

Referring to FIG. 23, the layout 23 may include pillar patterns 2012 arrayed on a first region 2011 of a substrate, a second peripheral pattern 2018 disposed on a second region 2019 of the substrate, and a first peripheral pattern 2016 disposed on a boundary region 2015 between the first and second regions 2011 and 2019. A first opening pattern 2017 may be disposed between the first peripheral pattern 2016 and the second peripheral pattern 2018. First domain patterns 2013 obtained by phase separation of a BCP layer may be disposed between the pillar patterns 2012. The pillar patterns 2012 and the first domain patterns 2013 may correspond to final target patterns which are actually formed on the substrate.

FIGS. 24 to 36 are cross-sectional views taken along a line C21-C21' of FIG. 23 to illustrate a method of forming patterns according to an embodiment.

Figure 24:
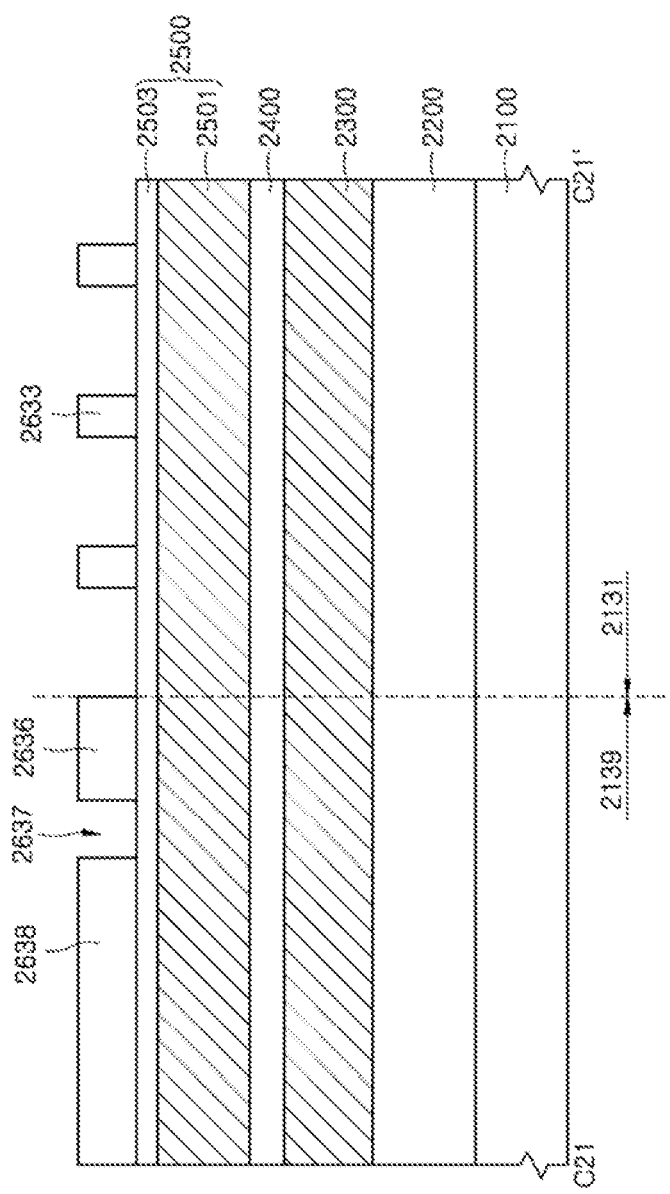
FIGS. 24 to 36 are cross-sectional views illustrating a method of forming patterns according to another embodiment.

FIG. 24 illustrates a step of forming mask patterns 2633, 2636 and 2638.

Referring to FIG. 24, the mask patterns 2633, 2636 and 2638 may be formed on a guide layer 2500. The mask patterns 2633, 2636 and 2638 may be used as etch masks when the guide layer 2500 is patterned in a subsequent etch process. The mask patterns 2633, 2636 and 2638 may include first patterns 2633 corresponding to the pillar patterns 2012 of FIG. 23, a second pattern 2636 corresponding to the first peripheral pattern 2016 of FIG. 23, and a third pattern 2638 corresponding to the second peripheral patterns 2018 of FIG. 23. A space region 2637 between the second pattern 2636 and the third pattern 2638 may correspond to an opening that has the same shape as the first opening pattern 2017 of FIG. 23 in a plan view. The mask patterns 2633, 2636 and 2638 may include a photoresist material.

In a subsequent process, the guide layer 2500 may be patterned to form guide patterns shown in FIG. 23 for defining positions of domain portions which are generated while a BCP layer is phase-separated. The guide layer 2500 may be formed on a semiconductor substrate 2100. The semiconductor substrate 2100 may include a first region 2131 in which the pillar patterns 2012 of FIG. 23 are densely disposed and a second region 2139 in which the peripheral patterns 2016 and 2018 of FIG. 23 are disposed. The guide layer 2500 may be formed on an underlying layer 2400 which is disposed on the semiconductor substrate 2100. The guide layer 2500 may include a first guide layer 2501. The first guide layer 2501 may be formed of a spin-on-carbon (SOC) layer having a thickness of about 700 o 800 angstroms. The guide layer 2500 may further include a second guide layer 2503. The second guide layer 2503 may be formed on the first guide layer 2501 to act as a capping layer. The second guide layer 2503 may be formed of a silicon oxynitride (SiON) layer having a thickness of about 300 angstroms.

In a subsequent process, the underlying layer 2400 may be patterned to form underlying patterns used as a portion of a hard mask or used to pattern another hard mask. For example, the underlying layer 2400 may correspond to any one of a plurality of layers constituting a multi-layered hard mask system. A dielectric layer 2200 and an etch target layer 2300 may be sequentially formed on the semiconductor substrate 2100 before the underlying layer 2400 is formed. The etch target layer 2300 or the dielectric layer 2200 may also be used as one of the plurality of layers constituting the multi-layered hard mask system or may be selectively etched using the multi-layered hard mask system in a subsequent process.

The dielectric layer 2200 may include a silicon oxide layer such as a tetraethyl orthosilicate (TEOS) layer having a thickness of about 100 angstroms or may include a polysilicon layer having a thickness of about 600 angstroms. The etch target layer 2300 may be formed on the dielectric layer 2200 to include an amorphous SOC layer having a thickness of about 730 to 1000 angstroms. In some embodiments, an additional etch target layer may be formed between the dielectric layer 2200 and the etch target layer 2300. For example, line-shaped patterns formed of the additional etch target layer may be disposed on the dielectric layer 2200 and may be buried in the etch target layer 2300. In such case, the line-shaped patterns may be cut to provide a plurality of short patterns while the etch target layer 2300 is patterned.

In some embodiments, the underlying layer 2400 may be formed on the etch target layer 2300 to include a first underlying layer and a second underlying layer sequentially stacked. The first underlying layer may be formed of a polysilicon layer having a thickness of about 300 to 350 angstroms. The second underlying layer may be formed of a material different from the first underlying layer. For example, the second underlying layer may be formed of an undoped silicate glass (USG) layer having a thickness of about 300 to 350 angstroms.

Figure 25:
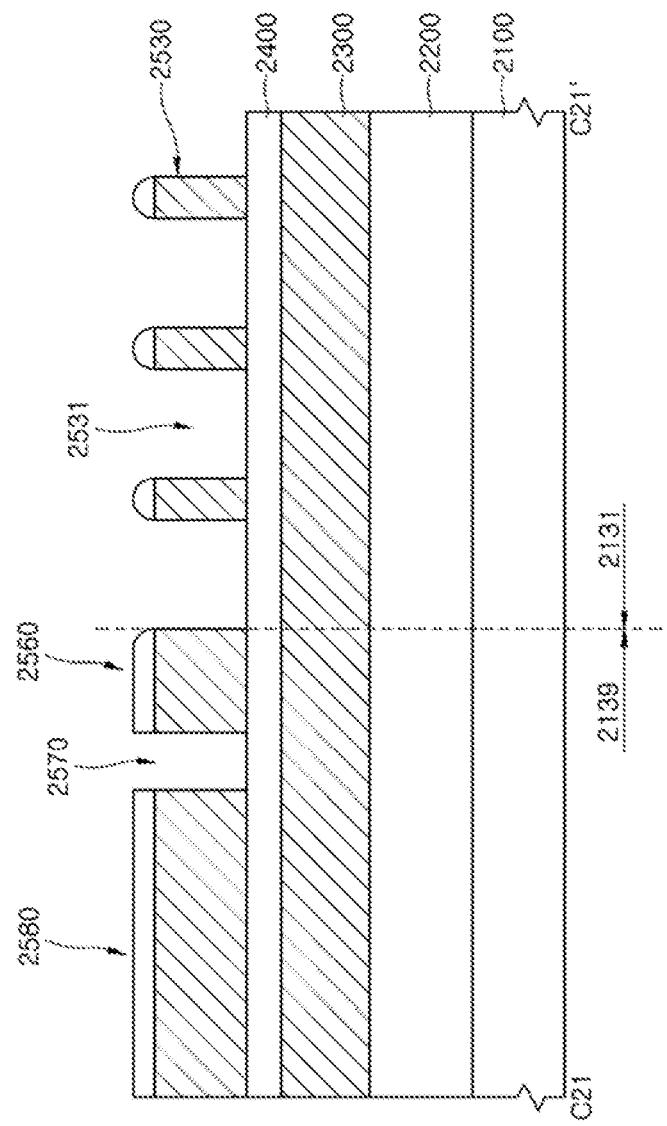

FIG. 25 illustrates a step of forming pillars 2530, a first peripheral pattern 2560 and a second peripheral pattern 2580

Referring to FIG. 25, the guide layer 2500 may be etched using the mask patterns 2633, 2636 and 2638 as etch masks, thereby forming an array of the pillars 2530, a first peripheral pattern 2560 and a second peripheral pattern 2580. The array of the pillars 2530 may be formed on the first region 2131 of the semiconductor substrate 2100, and the first and second peripheral patterns 2560 and 2580 may be formed on the second region 2139 of the semiconductor substrate 2100. A space region between the first and second peripheral patterns 2560 and 2580 may correspond to a first opening 2570. In some embodiments, the first and second peripheral patterns 2560 and 2580 may laterally extend to contact each other. In such case, a single peripheral pattern may be formed on the second region 2139 of the semiconductor substrate 2100 without the first opening 2570. A distance between the first peripheral pattern 2560 and the pillar 2530 closest to the first peripheral pattern 2560 is less than a distance between the first peripheral pattern 2560 and the second peripheral pattern 2580.

The pillars 2530 may be arrayed so that four adjacent pillars 2530 are respectively located at four vertices of a tetragon in a plan view. For example, the pillars 2530 may be formed to be respectively located at cross points of rows and columns in a plan view. In some embodiments, the pillars 2530 may be arrayed so that three adjacent pillars 2530 are respectively located at three vertices of a triangle in a plan view. The pillars 2530 may be arrayed so that gap regions 2531 are disposed between the pillars 2530 arrayed in each diagonal line that is parallel with a line C21-C21' of the first region 2131 in a plan view. As illustrated in FIG. 23, the pillar patterns 2012 corresponding to the pillars 2530 may be disposed so that a distance between the pillar patterns 2012 arrayed in each row or column is less than a distance between the pillar patterns 2012 arrayed in a diagonal line(Le., the line C21-C21' in the first region 2011. The pillars 2530 may be used as guide patterns inducing self-assembly of a BCP layer in a subsequent process.

Figure 26:
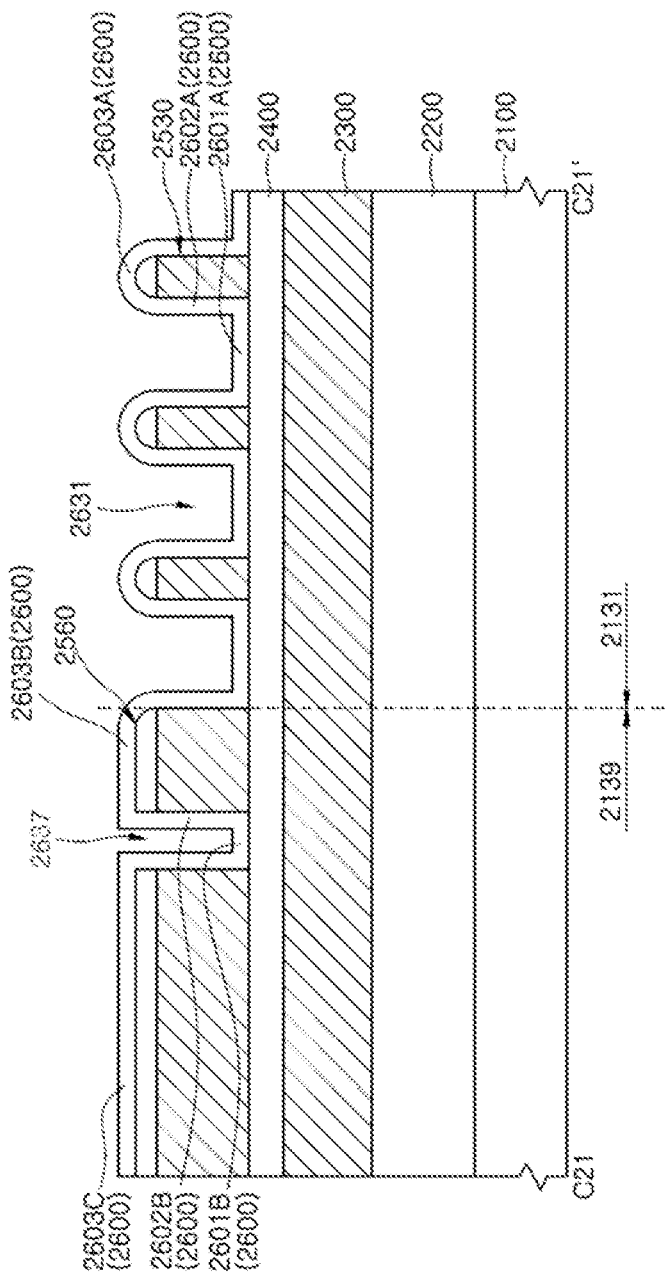

FIG. 26 illustrates step of forming a separation wall layer 2600.

Referring to FIG. 26, the separation wall layer 2600 may include first separation walls 2602A covering sidewalls of the pillars 2530 and second separation walls 2602B covering sidewalls of the first opening 2570. The separation wall layer 2600 may further include a first extension 2601A covering the underlying layer 2400 on the first region 2131 and second extensions 2603A covering top surfaces of the pillars 2530. In addition, the separation wall layer 2600 may further include a third extension 2601B covering the underlying layer 2400 on the second region 2139, a fourth extension 2603B covering a top surface of the first peripheral pattern 2560, and a fifth extension 2603C covering a top surface of the second peripheral pattern 2580.

The separation wall layer 2600 may be formed to have grooves that provide gap regions 2631 between the pillars 2530 and a gap region 2637 in the first opening 2570. The separation wall layer 2600 may be formed of an insulation material having an etch selectivity with respect to the pillars 2530 and the underlying layer 2400, For example, the separation wall layer 2600 may be formed of an ultra-low temperature oxide (ULTO) layer having a thickness of about 200 angstroms.

Figure 27:
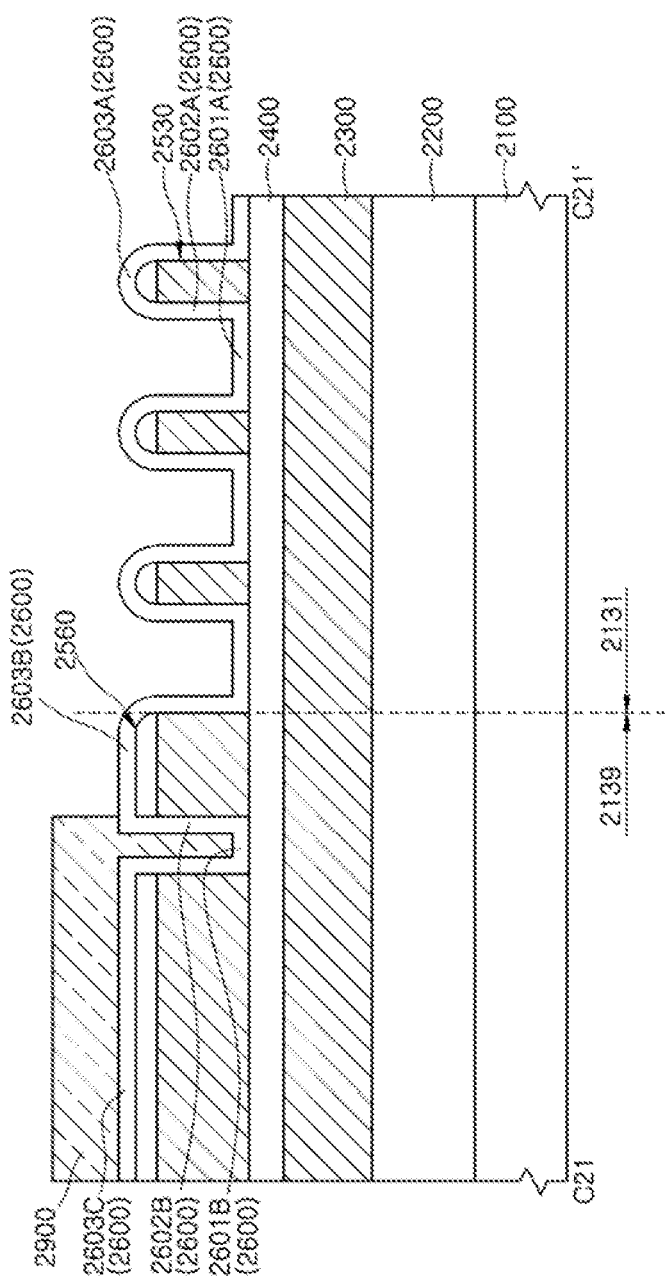

FIG. 27 illustrates a step of forming a blocking portion 2900.

Referring to FIG. 27, a blocking layer may be formed on the separation wall layer 2600, and the blocking layer may be patterned to form the blocking portion 2900 that exposes a portion of the separation wall layer 2600. The blocking layer may include a polysilicon layer. The blocking portion 2900 may be formed to fill the gap region 2637 in the first opening 2570. In addition, the blocking portion 2900 may be formed to expose the separation wall layer 2600 on the first region 2131 of the semiconductor substrate 2100 and the fourth extension 2603B of the separation wall layer 2600 overlapping with the first peripheral pattern 2560. In such case, the blocking portion 2900 may extend onto the fifth extension 2603C of the separation wall layer 2600. If a single peripheral pattern instead of the first and second peripheral patterns 2560 and 2580 is formed on the second region 2139 without the first opening 2570, the blocking portion 2900 may also be formed to expose the separation wall layer 2600 on the first region 2131 of the semiconductor substrate 2100 and a portion of the separation wall layer 2600 corresponding to the fourth extension 2603B.

Figure 28:
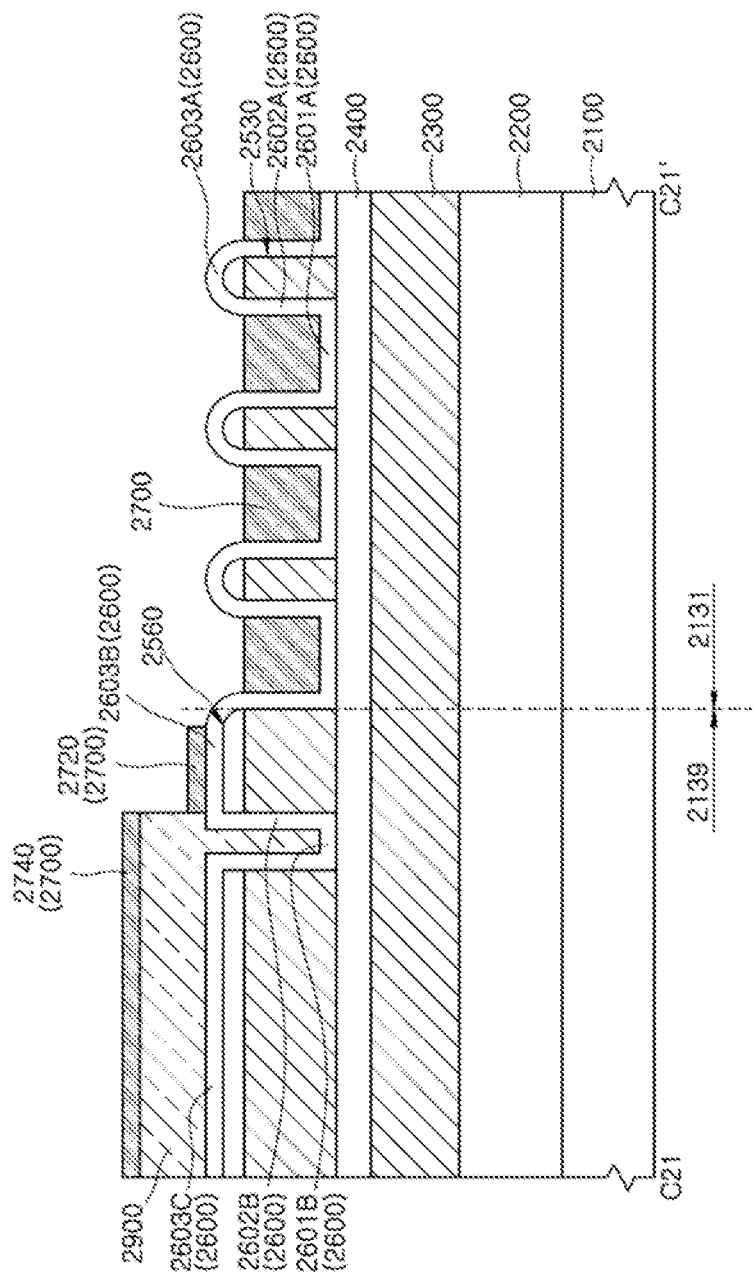

FIG. 28 illustrates a step of forming a BCP layer 2700.

Referring to FIG. 28, the BCP layer 2700 may be formed to fill the gap regions 2631 provided by the separation wall layer 2600 between the pillars 2530 in the first region 2131. The BCP layer 2700 may also be formed on the fourth extension 2603B of the separation wall layer 2600 and the blocking portion 2900 in the second region 2139. Since a top surface of the fourth extension 2603B of the separation wall layer 2600 is located at a lower level than a top surface of the blocking portion 2900 the BCP layer 2700 on the fourth extension 2603B may alleviate an abrupt level difference between the blocking portion 2900 and the second extensions 2603A of the separation wall layer 2600. If the blocking portion 2900 is formed to extend onto the fourth extension 2603B, the BCP layer 2700 may be coated so that a thickness of the BCP layer 2700 filling the gap regions 2631 adjacent to the first peripheral pattern 2560 may increase to cause process failure in a subsequent process for phase separation of the BCP layer 2700. Accordingly, for the BCP layer 2700 to be uniformly coated on the first region 2131 of the semiconductor substrate 2100 to prevent the phase separation failure of the BCP layer 2700 in a subsequent process, the blocking portion 2900 may be formed to expose the fourth extension 2603B of the separation wall layer 2600.

Figure 29:
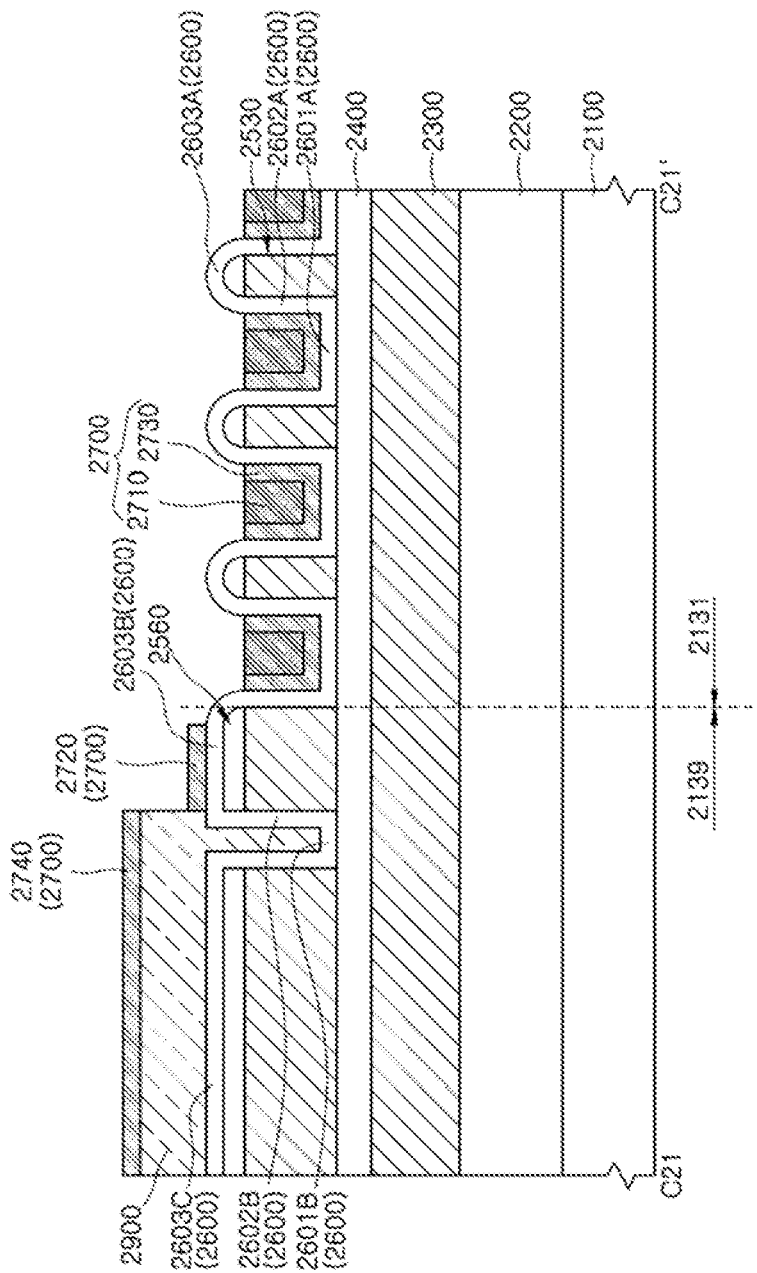

FIG. 29 illustrates a step of phase-separating the BCP layer 2700.

Referring to FIG. 29, the BCP layer 2700 may be phase-separated using an annealing process to form first domains 2710 located at central portions of the gap regions 2631 between the pillars 2530 and a second domain 2730 surrounding and isolating the first domains 2710 from each other. Each of the first domains 2710 may fill any one of cylinder-shaped grooves provided by the second domain 2730 to have a post shape. While the BCP layer 2700 is phase-separated to form the first domains 2710 and the second domain 2730, a portion 2720 of the BCP layer 2700 formed on the fourth extension 2603B of the separation wall layer 2600 and another portion 2740 of the BCP layer 2700 formed on the blocking portion 2900 may also be phase-separated. However, even though the portions 2720 and 2740 of the BCP layer 2700 are phase-separated to form first and second domains therein, pattern images of the first domains in the portions 2720 and 2740 of the BCP layer 2700 may not be transferred to the underlying layer 2400 in a subsequent process because of the presence of the blocking portion 2900 and the first peripheral pattern 2560 under the portions 2720 and 2740 of the BCP layer 2700.

Figure 30:
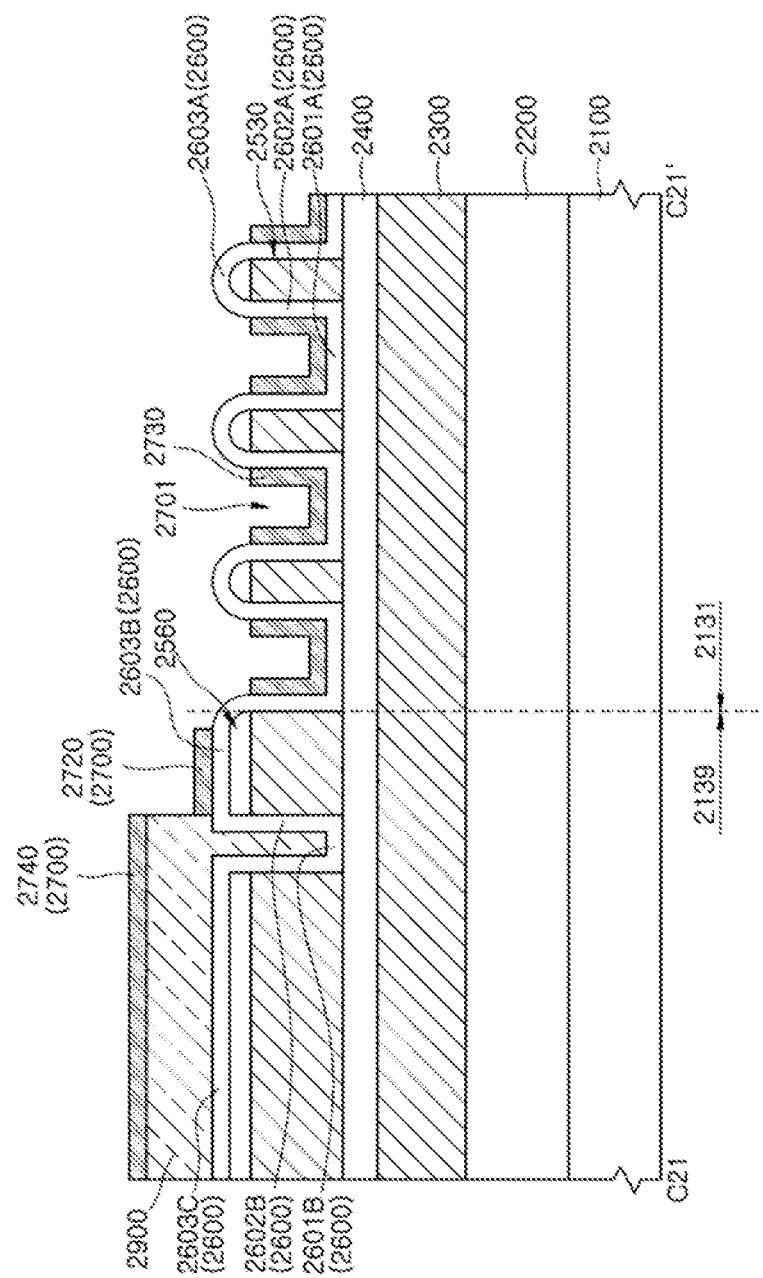

FIG. 30 illustrates a step of forming ninth openings 2701.

Referring to FIG. 30, the first domains 2710 of FIG. 29 may be selectively removed to form the ninth openings 2701 located between the pillars 2530.

Figure 31:
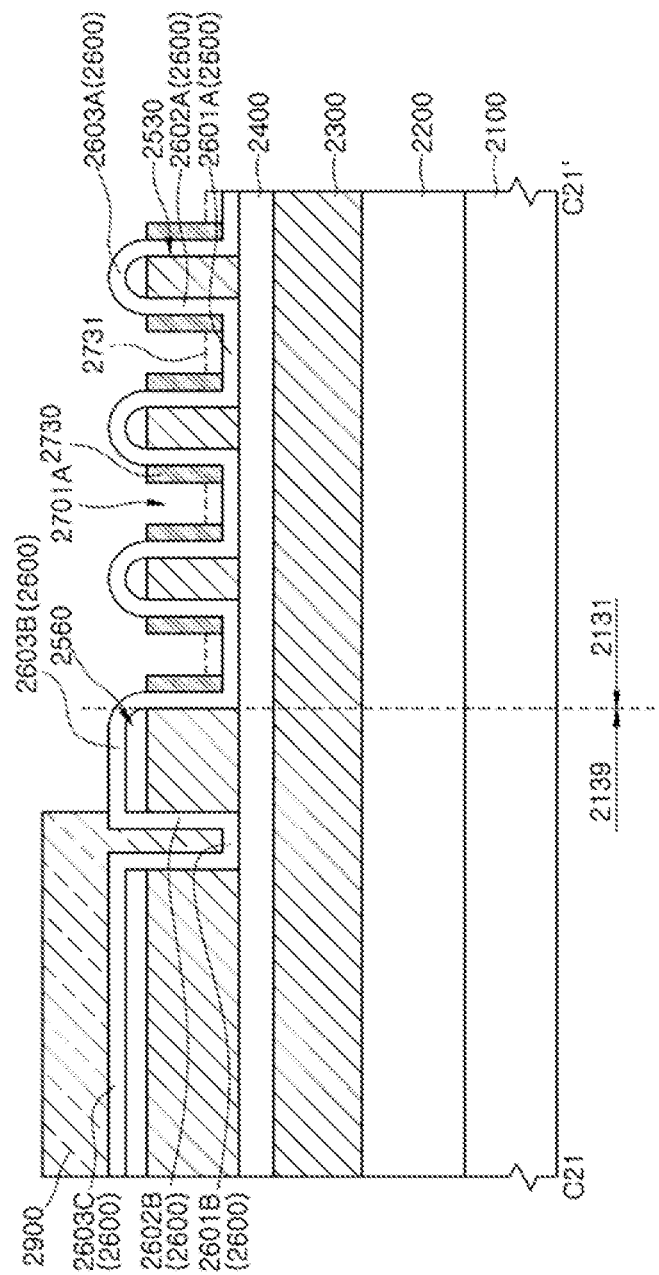

FIG. 31 illustrates a step of forming ninth opening extensions 2701A.

Referring to FIG. 31, bottom portions 2731 of the second domain 2730 exposed by the ninth openings 2701 may be selectively removed to form the ninth opening extensions 2701A that downwardly extend from the ninth openings 2701. While the bottom portions 2731 of the second domain 2730 are removed, the portions 2720 and 2740 of the BCP layer 2700 may also be removed to expose the top surfaces of the blocking portion 2900 and the fourth extension 2603B of the separation wall layer 2600.

Figure 32:
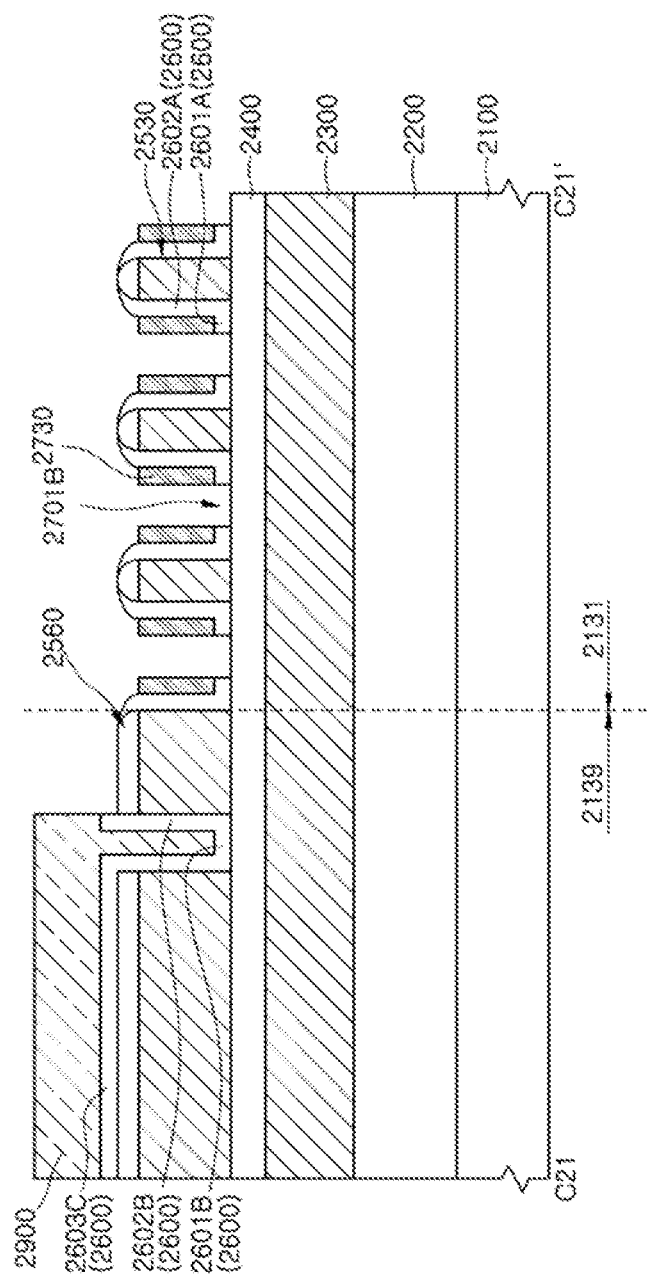

FIG. 32 illustrates a step of forming second openings 2701B.

Referring to FIG. 32, the first extensions 2601A of the separation wall layer 2600 exposed by the ninth opening extensions 2701A may be selectively removed to form the second openings 2701B. While the first extensions 2601A of the separation wall layer 2600 are selectively removed, the second extensions 2603A on the pillars 2530 and the fourth extension 2603B on the first peripheral pattern 2560 may also be etched and removed to expose the top surfaces of the pillars 2530 and the first peripheral pattern 2560.

Figure 33:
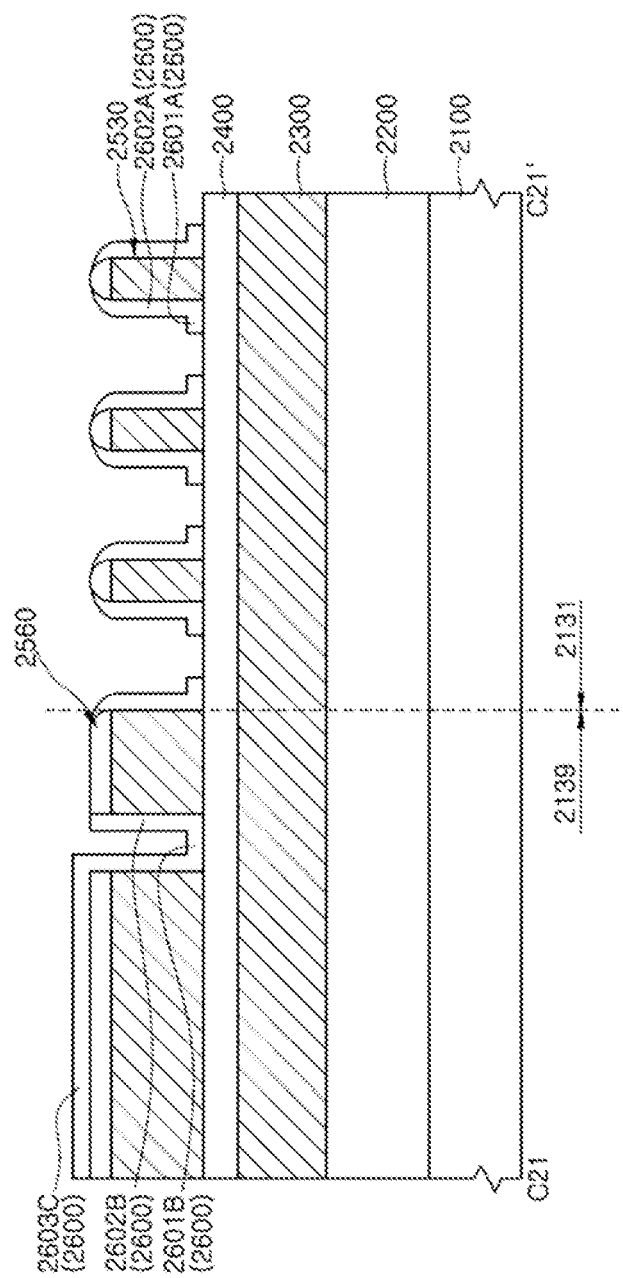

FIG. 33 illustrates a step of selectively removing the blocking portion 2900 of FIG. 32.

Referring to FIG. 33, the blocking portion 2900 and the remaining BCP layer 2700 (i.e., the second domain 2730) may be selectively removed. Even after the blocking portion 2900 is removed, the second peripheral pattern 2580 may still remain due to the presence of the fifth extension 2603C of the separation wall layer 2600.

Figure 34:
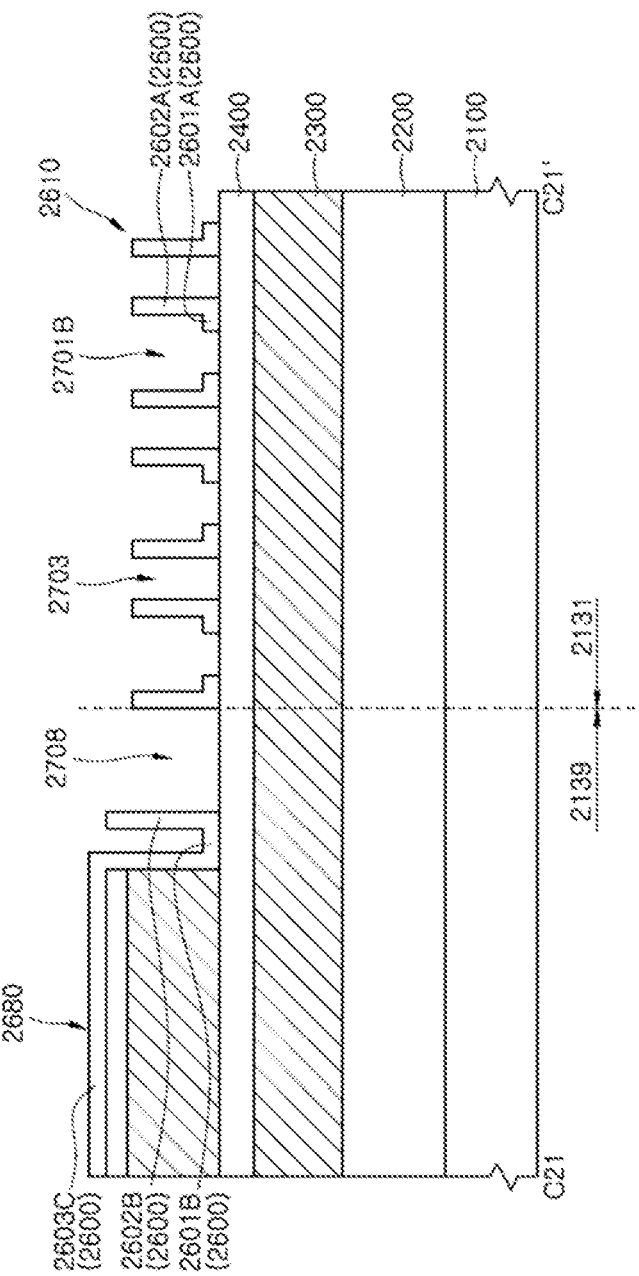

FIG. 34 illustrates a step of selectively removing the pillars 2530 and the first peripheral pattern 2560.

Referring to FIG. 34, the pillars 2530 and the first peripheral pattern 2560 may be selectively removed to form third openings 2703 provided by removal of the pillars 2530 and a fourth opening 2708 provided by removal of the first peripheral pattern 2560. If a single peripheral pattern instead of the first and second peripheral patterns 2560 and 2580 is formed on the second region 2139 without the first opening 2570, a portion of the single peripheral pattern corresponding to the first peripheral pattern 2560 may be selectively removed using a portion of the separation wall layer 2600 covering the remaining portion of the single peripheral pattern corresponding to the second peripheral pattern 2580 as an etch barrier pattern. In either case, a second separation wall pattern 2680 including the second separation walls 2602B, the third extension 2601B and the fifth extension 2603C may be formed on a portion of the second region 2139 of the semiconductor substrate 2100, and a first separation wall pattern 2610 including the first separation walls 2602A and the first extensions 2601A may be formed on the first region 2131 of the semiconductor substrate 2100.

Figure 35:
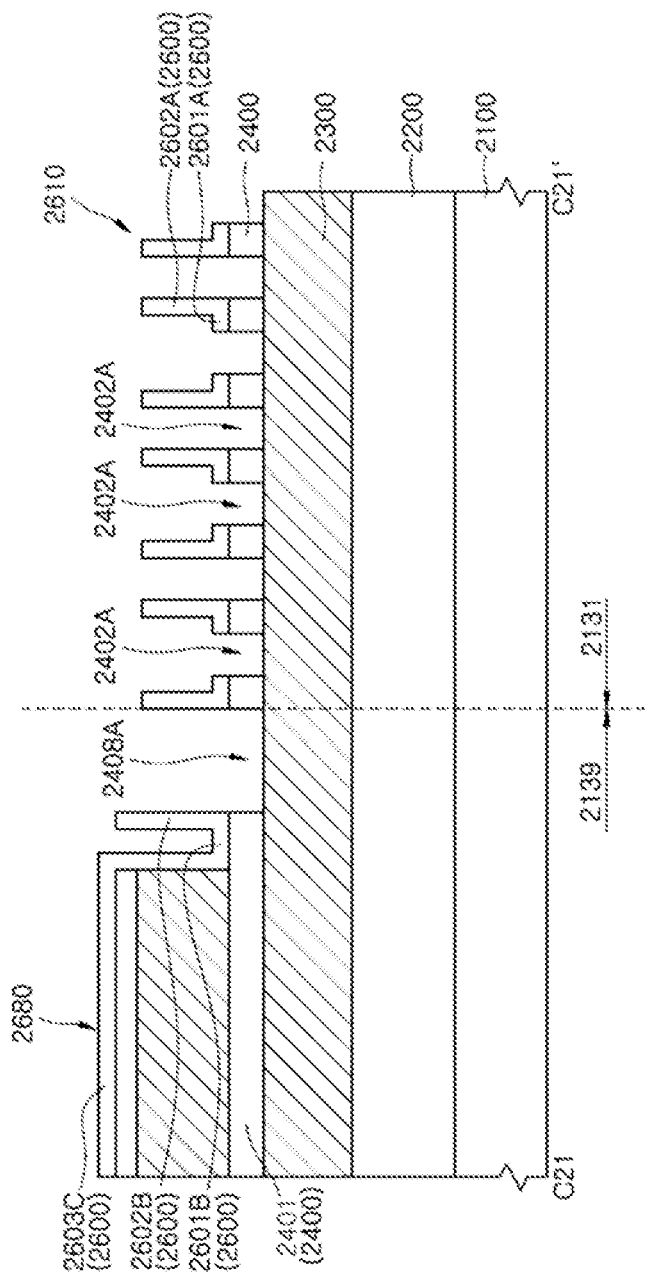
Figure 36:
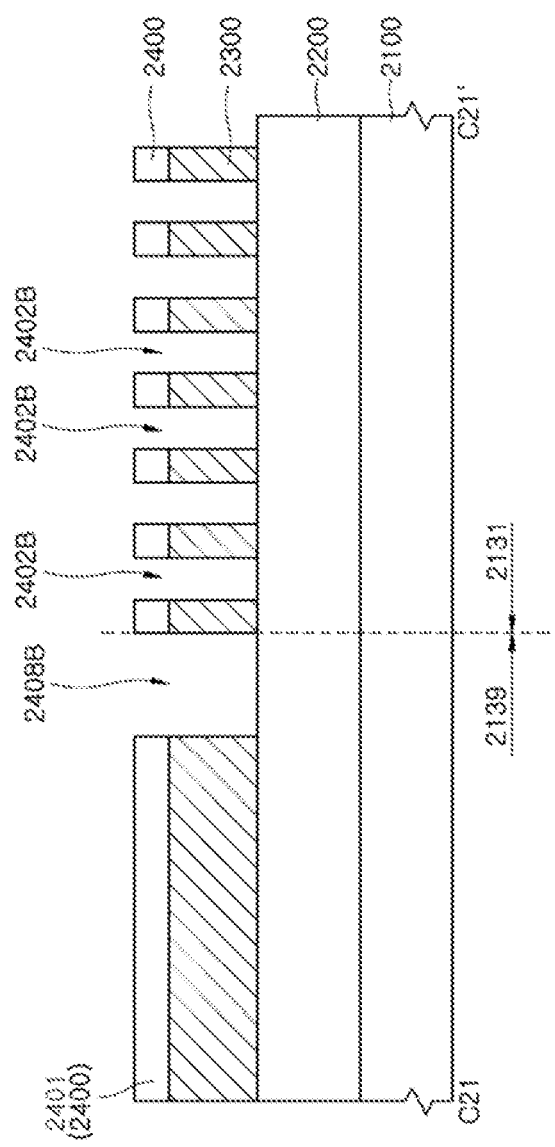

FIGS. 35 and 36 illustrate a step of forming fifth openings 2402B and a sixth opening 2408B.

Referring to FIGS. 35 and 36, the underlying layer 2400 on the first region 2131 of the semiconductor substrate 2100 may be etched using the first separation wall pattern 2610 as an etch mask, thereby forming fifth preliminary openings 2402A. The fifth preliminary openings 2402A may be formed to penetrate the underlying layer 2400.

During the etch process for forming the fifth preliminary openings 2402A, the underlying layer 2400 on the second region 2139 of the semiconductor substrate 2100 may also be etched using the second separation wall pattern 2680 as an etch mask, thereby forming a sixth preliminary opening 2408A. A portion 2401 of the underlying layer 2400 remaining below the second separation wall pattern 2680 may correspond to a peripheral pattern. A planar shape of the peripheral pattern 2401 may be defined by the sixth preliminary opening 2408A.

After formation of the fifth and sixth preliminary openings 2402A and 2408A, the first and second separation wall patterns 2610 and 2680 and the second peripheral pattern 2580 may be removed. The etch target layer 2300 may then be etched using the patterned underlying layer 2400 as an etch mask, thereby forming the fifth openings 2402B on the first region 2131 of the semiconductor substrate 2100 and the sixth opening 2408B on the second region 2139 of the semiconductor substrate 2100. In some embodiments, before the first and second separation wall patterns 2610 and 2680 and the second peripheral pattern 2580 are removed, the etch target layer 2300 may be additionally etched to form the fifth and sixth openings 2402B and the 2408B.

According to the embodiments described above, nano-scale structures or nano structures can be fabricated on a large-sized substrate using a phase separation technique of a BCP layer. The nano-scale structures may be used in fabrication of polarizing plates or in formation of reflective lenses of reflective liquid crystal display (LCD) units. The nano structures may also be used in fabrication of separate polarizing plates as well as in formation of polarizing parts including display panels. For example, the nano structures may be used in processes for directly forming the polarizing parts on array substrates including thin film transistors or color filter substrates. Further, the nano structures may be used in molding processes for fabricating nanowire transistors, memories, electronic/electric components such as nano-scaled interconnections, catalysts of solar cells and fuel cells, etch masks, organic light emitting diodes (OLEDs), and gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products to constitute signal processing devices. The end products may include toys, low-end application products, or high-end application products such as computers. For example, the end products may include display units, keyboards, or central processing units (CPUs).

The embodiments of the present disclosure have been disclosed above for illustrative purposes. Those of ordinary skill in the art will appreciate that various modifications, additions, and substitutions are possible, without departing from the scope and spirit of the present disclosure as stated in the accompanying claims.

What is claimed is:

1. A method of forming patterns, the method comprising:
forming pillars and first peripheral patterns on an underlying layer, the first peripheral patterns providing first openings therebetween;
forming a separation wall layer on the underlying layer to cover sidewalls of the pillars and sidewalls of the first peripheral patterns;
forming blocking portions on the separation wall layer to fill first gap regions in the first openings;
forming a block copolymer layer on the separation wall layer to fill second gap regions between the pillars;
annealing the block copolymer layer to form first domains and a second domain surrounding the first domains from the block copolymer layer, the second domain isolating the first domains from each other;
selectively removing the first domains to expose a bottom portion of the second domain;
selectively removing the exposed bottom portion of the second domain to expose portions of the separation wall layer and selectively removing the exposed portions of the separation wall layer to form second openings;
removing the second domain and the blocking portions;
removing the pillars and the first peripheral patterns to form third openings and fourth openings, respectively; and patterning the underlying layer to form fifth openings that extend from the second and third openings and sixth openings that extend from the fourth openings, wherein the fifth and sixth openings are formed to penetrate the underlying layer, wherein the separation wall layer includes first separation walls that cover the sidewalls of the pillars and a first extension that extends from the first separation walls to cover the underlying layer between the pillars, and wherein the separation wall layer includes second separation walls covering the sidewalls of the first peripheral patterns and third extensions that extend from the second separation walls to cover the underlying layer between the first peripheral patterns.

2. The method of claim 1, wherein the forming of the third and fourth openings includes:

forming a sacrificial layer that fills the second gap regions between the pillars and the first gap regions in the first openings;

recessing the sacrificial layer, the separation wall layer, the pillars and the first peripheral patterns; and selectively removing the recessed sacrificial layer, the recessed pillars and the recessed first peripheral patterns.

3. The method of claim 1, wherein the forming of the pillars includes:

defining a first layout of first target patterns corresponding to the fifth openings;

excluding first domain patterns corresponding to the first domains from the first layout of the first target patterns to define a second layout of pillar patterns corresponding to the pillars; and patterning a guide layer using mask patterns formed by transferring the layout of the pillar patterns as etch masks, to form the pillars.

4. The method of claim 1, wherein the pillars, as guide patterns, induce formation of the first domains at central portions of space regions, each of which is surrounded by four adjacent pillars.

5. The method of claim 1, wherein the pillars, as guide patterns, induce formation of the first domains at central portions of space regions, each of which is surrounded by three adjacent pillars.

6. The method of claim 1, wherein the block copolymer layer includes first polymer blocks and second polymer blocks which are phase-separated by an annealing process; and wherein the first polymer blocks are ordered to form the first domains and the second polymers are ordered to form the second domain, while the block copolymer layer is annealed.

7. The method of claim 1, wherein the forming of the first peripheral patterns includes:

defining a third layout of second target patterns corresponding to second peripheral patterns; and reversing the third layout of the second target patterns to define a fourth layout of third target patterns corresponding to the first peripheral patterns.

8. The method of claim 7, wherein portions of the underlying layer remaining between the sixth openings are formed to have substantially the same planar shape as the second target patterns.

9. The method of claim 1, wherein the second domain is formed to cover the first separation walls and the first extension; and wherein the second domain surrounds bottom surfaces and sidewalls of the first domains to provide a plurality of concave surfaces.

10. The method of claim 9, wherein the forming of the second openings includes:

removing the first domains to form ninth openings that expose the concave surfaces of the second domain;

removing bottom portions of the second domain exposed through the ninth openings to form ninth opening extensions; and removing portions of the first extension of the separation wall layer exposed through the ninth opening extensions to form the second openings.

11. The method of claim 10, wherein the forming of the fifth openings includes:

selectively etching portions of the underlying layer exposed through the second openings and the third openings.

12. The method of claim 1, wherein the blocking portions are formed to partially fill the first gap regions in the first openings and to provide seventh openings thereon; and wherein the seventh openings expose upper portions of the second separation walls of the separation wall layer covering the sidewalls of the first peripheral patterns.

13. The method of claim 12, wherein the separation wall layer includes the third extensions that extend from the second separation walls to cover bottom surfaces exposed by the first openings; and wherein the second separation wall and the third extension form a concave feature.

14. The method of claim 12, wherein the block copolymer layer is formed to fill the seventh openings in the forming of the block copolymer; and wherein the block copolymer layer filling the seventh openings is phase-separated to form third domains located in central portions of the seventh openings and fourth domains surrounding the third domains in the annealing of the block copolymer layer.

15. The method of claim 14, wherein the third domains are removed to provide eighth openings in the selectively removing of the first domains; and wherein the blocking portions prevent portions of the separation wall layer under the eighth openings from being exposed.

16. A method for forming patterns, the method comprising:

forming pillars and first peripheral patterns on an underlying layer, the first peripheral patterns providing first openings therebetween;

forming a separation wall layer on the underlying layer to cover sidewalls of the pillars and sidewalls of the first peripheral patterns;

forming a block copolymer layer on the separation wall layer to fill second gap regions between the pillars;

annealing the block copolymer layer to form first domains and a second domain surrounding the first domains from the block copolymer layer, the second domain isolating the first domains from each other;

selectively removing the first domains to expose a bottom portion of the second domain;

selectively removing the exposed bottom portion of the second domain to expose portions of the separation wall layer and selectively removing the exposed portions of the separation wall layer to form second openings;

forming a sacrificial layer that fills the second gap regions between the pillars and first gap regions in the first openings;

etching back the sacrificial layer, the separation wall layer, the pillars and the first peripheral patterns to expose the separation wall layer, the pillars and the first peripheral patterns;

selectively removing the sacrificial layer, the exposed pillars and the exposed first peripheral patterns to form third openings provided by removal of the exposed pillars and fourth openings provided by removal of the exposed first peripheral patterns; and patterning the underlying layer using the exposed separation wall layer as an etch mask to form fifth openings that extend from the second and third openings and sixth openings that extend from the fourth openings, wherein the fifth and sixth openings are formed to penetrate the underlying layer, wherein the separation wall layer includes first separation walls that cover the sidewalls of the pillars and a first extension that extends from the first separation walls to cover the underlying layer between the pillars, and wherein the separation wall layer includes second separation walls covering the sidewalls of the first peripheral patterns and third extensions that extend from the second separation walls to cover the underlying layer between the first peripheral patterns.

17. The method of claim 16, wherein the peripheral pattern includes a first peripheral pattern and a second peripheral pattern providing a first opening therebetween, wherein the first portion of the peripheral pattern includes the first opening and the second peripheral pattern, and the second portion of the peripheral pattern includes the first peripheral pattern.

18. The method of claim 16, the method further comprising;
    forming a blocking portion on a portion of the separation wall layer to overlap with the first opening and the second peripheral pattern.

19. A method for forming patterns, the method comprising:

forming pillars and peripheral patterns on an underlying layer;

forming a separation wall layer on the underlying layer to cover sidewalls of the pillars and sidewalls of the peripheral patterns;

forming a blocking portion on a portion of the separation wall layer overlapping with a first portion of the peripheral patterns;

forming a block copolymer layer on the separation wall layer to fill gap regions between the pillars;

annealing the block copolymer layer to from first domains and a second domain surrounding the first domains from the block copolymer layer, the second domain isolating the first domains from each other;

selectively removing the first domains to expose a bottom portion of the second domain;

selectively removing the exposed bottom portion of the second domain to expose portions of the separation wall layer and selectively removing the exposed portions of the separation wall layer to form first openings;

removing the blocking portion;

removing the pillars and a second portion of the peripheral patterns to form second openings and a third opening, respectively; and patterning the underlying layer to form fourth openings that extend from the first and second openings and a fifth opening that extends from the third opening, wherein the fourth and fifth openings are formed to penetrate the underlying layer wherein the separation wall layer includes first separation walls that cover the sidewalls of the pillars and a first extension that extends from the first separation walls to cover the underlying layer between the pillars, and wherein the separation wall layer includes second separation walls covering the sidewalls of the peripheral patterns and third extensions that extend from the second separation walls to cover the underlying layer between the peripheral patterns.

* * * * *